(12) United States Patent
Brooks et al.

(10) Patent No.: US 6,417,625 B1
(45) Date of Patent: Jul. 9, 2002

(54) APPARATUS AND METHOD FOR FORMING A HIGH PRESSURE PLASMA DISCHARGE COLUMN

(75) Inventors: Neil H. Brooks, San Diego; Torkil H. Jensen; Charles P. Moeller, both of Del Mar, all of CA (US)

(73) Assignee: General Atomics, San Diego, CA (US)

( * ) Notice: Subject to any disclaimer, the term of this patent is extended or adjusted under 35 U.S.C. 154(b) by 0 days.

(21) Appl. No.: 09/632,651

(22) Filed: Aug. 4, 2000

(51) Int. Cl.$^7$ .................................................. H01J 7/24
(52) U.S. Cl. ............................... 315/111.31; 315/111.71
(58) Field of Search .................... 315/111.21, 111.31, 315/111.71; 427/569, 570, 571

(56) References Cited

U.S. PATENT DOCUMENTS

| | | | |
|---|---|---|---|
| 4,316,434 A | 2/1982 | Bailey | 122/20 B |
| 4,700,638 A | 10/1987 | Przewalski | 110/346 |
| 4,902,935 A | 2/1990 | Wood | 315/112 |
| 5,391,855 A | 2/1995 | Tanisaki | 219/121.43 |
| 5,405,514 A | 4/1995 | Berman et al. | 204/164 |
| 5,439,652 A | 8/1995 | Sczechowski et al. | 422/186.3 |
| 5,478,608 A | * 12/1995 | Gorokhovsky | 427/571 |
| 5,521,351 A | 5/1996 | Mahoney | 219/121.59 |
| 5,529,633 A | 6/1996 | Enniss et al. | 118/723 R |
| 5,552,675 A | 9/1996 | Lemelson | 315/111.21 |
| 5,671,045 A | 9/1997 | Woskov et al. | 356/316 |
| 5,798,496 A | 8/1998 | Eckhoff et al. | 219/121.36 |
| 5,945,012 A | 8/1999 | Chan | 219/121.43 |
| 5,977,724 A | 11/1999 | Dolan et al. | 315/248 |
| 6,124,563 A | * 9/2000 | Witherspoon et al. | 427/446 |

OTHER PUBLICATIONS

The Inductively Coupled Radio Frequency Plasma, by Maher I. Boulos, Plasma Technology Research Center (CRTP), Dept. of Chemical Engineering, Universite de Sherbrooke, Sherbrooke, Quebec, Canada (1997).

Elektrotechnische Zeitschrift, E. C. Zehmo/Dr. F. Meigner, Veriag von Julius Springer in Berlin, Apr. 22, 1909.
Elektrische Bogen und thermisches Plasma, von W. Finkelnburg und H. Maecker, Encyclopedia of Physics, Berlin, Springer Verlag (1957), pp. pp. 299–301 and 440–444.
Energy Balance of the High Pressure Mercury Discharge With Sodium– and Scandium–Lodide Additives by James T. Dakin and Richard P. Gilliard, Feb. 27, 1987, pp. 79–81.
Characteristics of Rotationally Stabilized Long Plasma Arcs in a Chamber by Hsu–Chieh Yeh and Wen–Jei Yang, Department of Mechanical Engineering, The University of Michigan, Ann Arbor, Michigan 48104, Jan. 27, 1969, pp. 3687–3693.
14. Einflussauberer mechanischer oder magnetischer Krafte auf den Lichtbogen, Handbuch der Physik, Bd. XXII 18 (1957), pp. 273–274.
Principles of Arc Motion and Displacement, Heinz H. Maecker, Proceedings of the TECE, Arc Motion and Development, vol. 59, No. 4, Apr. 1971, pp. 439, 447–448.
Uber die Temperatur in der Gassaule eines Lichtbogens, Von Alfred v. Engel und Max Steenbeck, Mit 7 Bildern, 1931, pp. 155–171.

(List continued on next page.)

Primary Examiner—Don Wong
Assistant Examiner—Thuy Vinh Tran
(74) Attorney, Agent, or Firm—Fitch, Even, Tabin & Flannery

(57) ABSTRACT

An apparatus for producing a stable, high pressure plasma column with long length, and high axial uniformity. Rotating a gas-filled tube about an horizontal axis creates a vortex with minimal, or no shear flow. Such a vortex provides a stable equilibrium for a central column of high temperature gas and plasma when, for a given rotation speed, the centrifugal force dominates over the gravitational force inside the smallest radial dimension of the containment envelope. High pressure discharges inside a rotating envelope may be sustained by a variety of energy sources, including electrical, electromagnetic and chemical; they may find application in plasma torches, light sources, etc.

30 Claims, 15 Drawing Sheets

OTHER PUBLICATIONS

Untersuchungen am stabilisierten elektrischen Lichtbogen (Walzbogen) in Stickstoff und Kohlensaure bei Drucken von 1 bis 40 at., Von Rudolf Foitzik, Mit 34 Bildern, 1939, pp. 28–58.

Temperatur und strahlungsmessungen am wasserstabilisierten Hochdruckbogen, Th. Peters, Mit 10 Figuren im Text, 1953, Zeitschrift fur Physik, Bd. 135, S. 573–592.

Model and diagnostics of the high–pressure mercury discharge with sodium Iodide additives, by James T. Dakin, Power Electronics Laboratory, Corporate Research and Development, General Electric Company, and Richard P. Gilliard, Lighting Research and Technical Services Operation, Lighting Business Group, General Electric Company, J. Appl. Phys. 60 (4), Aug. 15, 1986, pp. 1281–1288.

On Convection Currents in High Pressure Mercury Arcs, by Carl Kenty, General Electric Vapor Lamp Company, Hoboken, New Jersey, Journal of Applied Physics, vol. 9, Jan. 1938, pp. 53–55, 63–66.

* cited by examiner

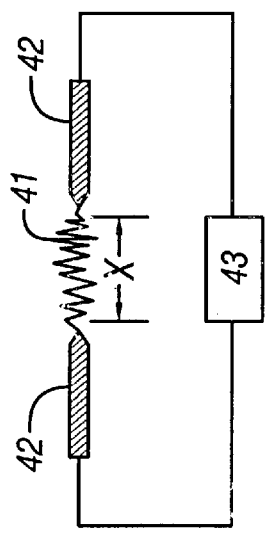
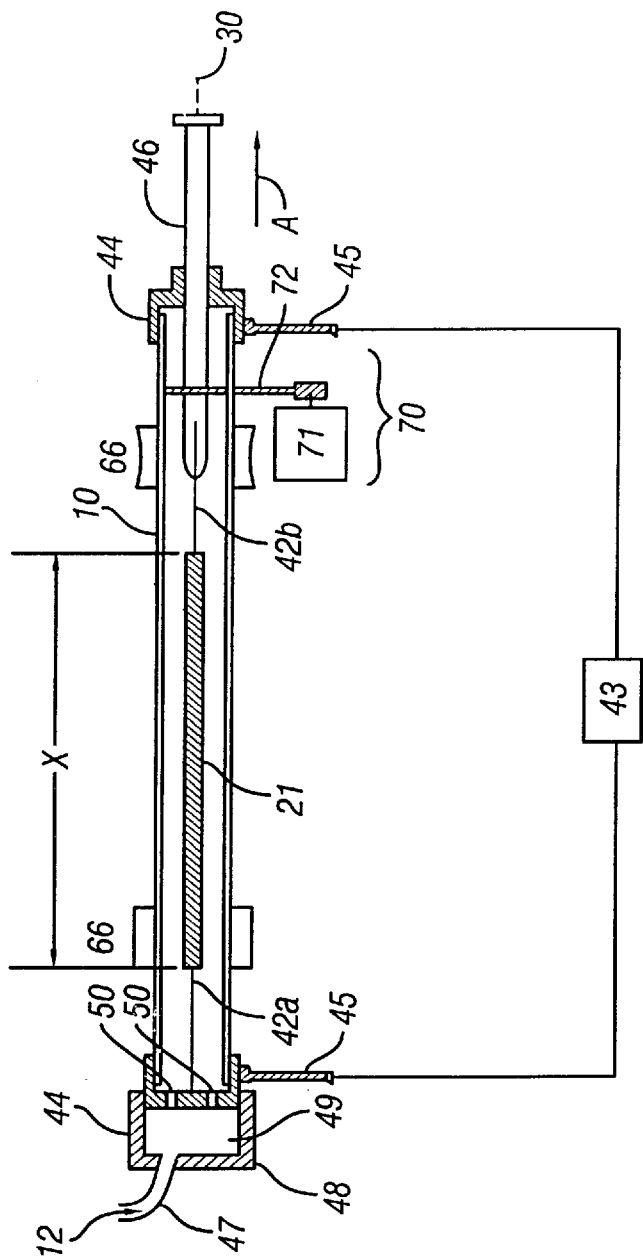
FIG. 4A
FIG. 4B

APPARATUS AND METHOD FOR FORMING A HIGH PRESSURE PLASMA DISCHARGE COLUMN

TECHNICAL FIELD

The present invention relates to high pressure, plasma discharge devices. In particular, the present invention pertains to the stability of high pressure plasma columns within such devices conferred by the mechanical rotation of their envelopes. Also, the present invention relates to methods and apparatuses for forming stable plasma columns at high pressure in both open-ended and sealed discharge containment envelopes so as to produce plasma torches, waste reprocessing devices, ultraviolet, visible, infrared, and x-ray light sources, or high intensity illumination.

BACKGROUND OF THE INVENTION

Over the years, many devices have been evolved which attempt to generate, control and use high pressure plasmas for various applications. Each of these devices has certain disadvantageous limitations. The embodiments of the present invention overcome many of the disadvantages of existing technologies by utilizing rotation of the containment envelope to establish a nearly perfect, rigid rotor flow of the gases within. The artificial gravity associated with this rotational flow acts to both center and confine a bubble of plasma and hot gases.

In the context of the present patent document a plasma is a vapor (usually created from a plasma forming fill in gaseous phase) which includes both neutral particles and charged particles, the latter consisting of electrons and ions. The ions, in turn, may be a combination of atomic ions, charged radicals and/or molecular ions, in which the balance among these different species is dependent on temperature, pressure and the nature of the plasma forming fill. By carefully controlling the environmental conditions in and around the plasma, a plasma column can be formed which is physically isolated from the material boundary of the confinement envelope by an intervening layer of neutral gas. Thus, the plasma column may occupy a cylindrical volume that is smaller than the volume enclosed by the containment envelope.

Since the early 60s, high pressure rf (radio frequency) heated discharges have relied on the use of a "swirl gas" to center the plasma columns produced in such electrodeless devices and to prevent hot plasma from contacting the walls of the containment envelope. Because of the circulatory flow of the injected swirl gases, the term "vortex stabilization" is generally used to characterize this technique. The swirl gas method of vortex stabilization has been applied to a broad range of rf devices. See, for example, Boulos, M. I., in "The Inductively Coupled Radio Frequency Plasma," High Temp. Material Processes, 1, 17 (1997) or Reed, T. B., J. Appl. Phys., 32, 821 (1961) both of which are hereby incorporated by reference. The swirl gas technique makes it possible to establish plasma columns within containment envelopes at gas pressures from a fraction of atmospheric pressure to many times atmospheric pressure. The plasma columns need not be straight. With the aid of vortex stabilization, a high pressure, rf-heated toroidal discharge has been achieved. See, for example, A. Okin et al., in "Generation of Toroidal Plasma—Atmospheric Ar Gas-Insulated Plasma Source with Quartz and Metallic Discharge Tubes," Proc. Symp on Plasma Science for Materials, ISSN 0919-7621 (1993) which is hereby incorporated by reference.

In addition to electrodeless discharges heated with rf power, the swirl gas method of vortex stabilization has been applied in electrodeless, high pressure torches powered with microwaves. (e.g., U.S. Pat. No. 5,671,045).

Although the plasma columns formed by the swirl gas technique of vortex stabilization are approximately centered within their containment envelopes and stationary in a gross sense, they are not quiescent on the microscopic level. Viscous drag on the stationary wall of the containment envelope results in a sheared flow of the gas which generates turbulence, giving rise to enhanced thermal transport of energy from the hot plasma column to the cooler envelope walls. Such a degradation in the insulating properties of the annular sheath of cooler gas surrounding the plasma column necessitates an increased power to sustain the plasma discharge. Additionally, turbulence causes mixing of the gas within the sheath and between the gas in the plasma column and that in the sheath. As a practical matter, when such a technique of vortex stabilization is used, the turbulence so generated mainfests itself as excess noise in the light emission of the plasma column, which can degrade the accuracy of certain spectroscopic measurements. As a further practical matter, the tip of the plasma plume in vortex stabilized torches is not perfectly stable, demonstrating the characteristic of "wandering" or "flickering" with respect to the center axis of the torch. Therefore, such torches are unsuitable for applications in which precise positioning is required.

The concept of rotating a containment envelope has been used in "sulfur bulb" lamp technologies (e.g., Pat. Nos. 4,902,935 and 5,404,076) to minimize variations in the surface temperature of a spherical bulb (hot spots, caused by locally high electric fields occurring in resonant microwave cavities or in coaxial termination fixtures) and to make the spatial distribution of visible light emission from these bulbs more uniform. The patents referenced above deal only with sealed bulbs powered by microwaves for application to high intensity lighting. To eliminate hot spots these patents state that the axis of rotation should be oriented in a certain angular range with respect to the electric field direction in the resonant microwave cavity.

Therefore, what is needed is a method and apparatus for producing a stable, high pressure plasma discharge that can be sustained with a minimum of power. Also, there is a need for creating stable plasma columns which are both long and straight. Also, there is a need for methods and apparatus for generating a stable plasma column inside a containment envelope whereby the effects of shear flow-generated turbulence and buoyancy-driven radial convection are substantially reduced in the gas outside the radius of the plasma column. There is also a need for methods and apparatus for forming a plasma torch having a plasma plume, or flame, which maintains a stable position centered on an axis of rotation of a containment envelope.

SUMMARY OF THE INVENTION

The present invention provides methods and apparatus for forming a stable equilibrium for a high pressure plasma column in a stable equilibrium.

In various embodiments a stable, high pressure plasma column is produced by an apparatus comprising i) a containment envelope having a plasma-forming fill inside, ii) means for rotating the containment envelope, iii) means for initiating a discharge (that is, achieving "breakdown" or "ignition") in the plasma-forming fill, and iv) means for heating and sustaining the resulting plasma in a steady state or pulsed manner. Furthermore, particular embodiments permit adjusting the diameter of a cylindrical surface enclosing the plasma column by varying the rate of rotation of the containment envelope.

Ignition of the high pressure discharge inside the rotating containment envelope may be accomplished by means of electrical, electromagnetic (such as radio frequency waves, microwaves, or light waves) or chemical sources of energy. These same sources of energy, individually or in combination with one another, may be used to heat and sustain the resulting plasma in a steady state or pulsed manner. The means of ignition and sustainment may utilize the same source of energy, or different ones.

Various embodiments provide methods and apparatus for rotating said envelope so as to bring the vapors inside the containment envelope into co-rotation with the spinning envelope. Under such conditions of rigid rotor flow, a radially outward directed, artificial gravity is established which forces more dense gases (colder gases) outward toward the wall of the containment envelope and less dense vapors (plasma and neutral gases that have been heated) inward toward the axis of rotation. Buoyancy-driven radial convection of the contained vapors is suppressed in an annular region outside the cylindrical surface at which the magnitude of the artificial gravity produced by rotation just equals the magnitude of the radially directed component of earth's gravity. The annular region in which radial convection is suppressed is hereinafter referred to as the sheath region. Also, turbulence caused by sheared circulatory flow is absent in this sheath region. The excellent insulation properties of this quiescent gas sheath makes it possible to sustain an interior discharge column with a minimum of power. However, the artificial gravitational force produced by rotation becomes increasingly weak with decreasing radius, falling to zero on the rotational axis. Inside the radius at which the constant downward pull of earth's gravity dominates in magnitude over the centrifugal force induced by rotation, buoyancy-driven radial convection can not be suppressed. Gas inside this radius mixes and rigid rotor flow can not be sustained.

Further embodiments contemplate both sealed and open-ended containment envelopes. In the open-ended ones, a forced axial flow of gas may be produced by injecting gas at positive pressure parallel to the rotation axis; or a natural, buoyancy-driven axial flow, by inclining the rotation axis of the envelope. Axial flow, forced or natural, can be used to extend the plasma column out one end of the open-ended envelope to form a plasma plume or "flame" of a plasma torch.

Additionally, the principles illustrated by the embodiments described herein contemplate methods and devices for making very long plasma columns.

Other features of the present invention are disclosed or made apparent in the section entitled "DETAILED DESCRIPTION OF THE INVENTION".

BRIEF DESCRIPTION OF THE DRAWINGS

For a fuller understanding of the present invention, reference is made to the accompanying drawings in the following Detailed Description of the Invention. Reference numbers and letters refer to the same or equivalent parts of the invention throughout the several figures of the drawings. In the drawings:

FIG. 4(a) depicts the usual convex-upward shape of an electric arc in ambient air.

FIGS. 4(b), 4(c) and 4(d) are side view cross sections and an axial section view of two embodiments of the present invention energized by an electric current flowing through the length of the plasma column.

FIGS. 16(a)–(d) are perspective and side views of an embodiment of the containment envelope.

DETAILED DESCRIPTION OF THE INVENTION

The following description of the presently contemplated best mode of practicing the invention is not to be taken in a limiting sense, but is made merely for the purpose of describing the general principles of the invention. The scope of the invention should be determined with reference to the claims.

Figure 1A:
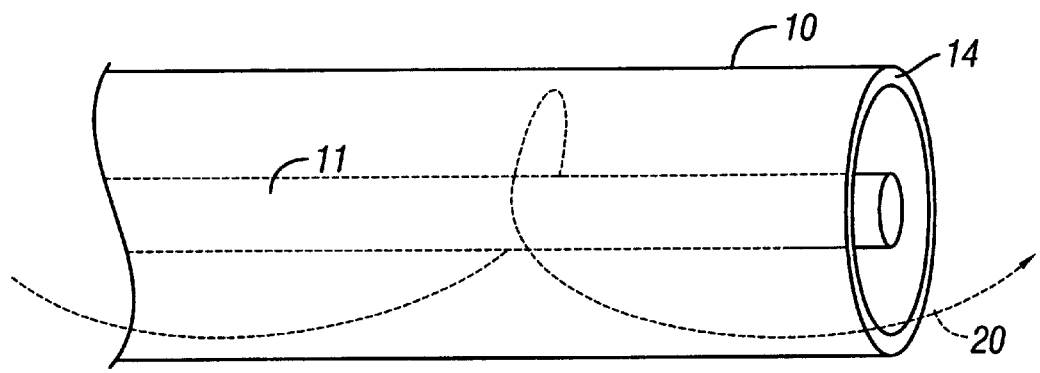
FIGS. 1(a) and 1(b) are perspective and end views depicting gas behavior in a typical swirl gas torch.
Figure 1B:
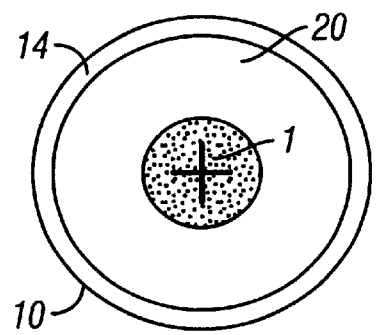

The traditional method of vortex stabilization uses a "swirl gas" to center a plasma column in electrodeless gas discharges, for example, those used in plasma torches. FIGS. 1(a) and 1(b) depict gas and plasma behavior in a typical swirl gas torch powered by rf or microwaves. A tangential flow of gas 20 is injected into an end of the envelope 10 creating a vortex which confines the hot gas and plasma to a centrally positioned plasma column 11. The swirl gas 20 forms an annular layer which separates the plasma column 11 from the envelope wall 14. Because the wall of the tube is stationary, viscous drag in the gas layer bounded by the wall causes the radial velocity distribution of the gas in the vortex to deviate from that of a rigid rotor. The rotational velocity assumes a peak at some intermediate location between the axis and the wall and a value near zero at the radius of the stationary wall. The strongly sheared flow pattern near the wall generates whirlpools or eddies which propagate radially inward, inducing mixing and turbulence. Because the boundary conditions for rigid rotor flow are not satisfied (due to the presence of the stationary containment envelope wall), the swirl gas method of vortex stabilization is necessarily accompanied by turbulence, which has the undesirable effect of enhancing radial heat transport. Furthermore, a swirl gas vortex loses strength with axial distance from the point of injection of the swirl gas; this sets a limitation on the length of the plasma column which may be centered by this method.

For a more complete explanation and understanding of such shear flow and turbulence effects, reference is made to A. Einstein's 1926 paper: "Die Ursache der Maeanderbildung der Fluszlaeufe und des sogennannten Baerschen Gesetzes, Die Naturwissenshaften XX,223 (1926) which is hereby incorporated by reference.

In contrast to conventional devices, the embodiments described herein advantageously use a containment envelope rotating about a horizontal, or substantially horizontal axis to create a vortex flow in which the collective motion of the gas atoms inside closely approximates rigid rotor flow. Here, the word "horizontal" means perpendicular to the gravitational force, regardless of whether the gravitational force is a unidirectional force generated by the earth's mass or, for example, by the circulation of the containment envelope about an axis external to itself, for example, residence in a large spinning system such as the proposed U.S.-Russian space station. Given sufficient time to come into equilibrium with the rotating envelope, the gas fill inside a sealed containment envelope must attain an angular velocity which is independent of radius, which is equivalent to saying, a tangential velocity which increases linearly with radius. Such a radial distribution of velocities is exactly that which gas particles would have were they fixed to a rigidly rotating disk. The variety of advantages rigid rotor flow holds over the sheared flow pattern produced by conventional technologies will be discussed in detail below. One advantage that is immediately apparent is the avoidance of excess thermal losses caused by turbulence.

Figure 2A:
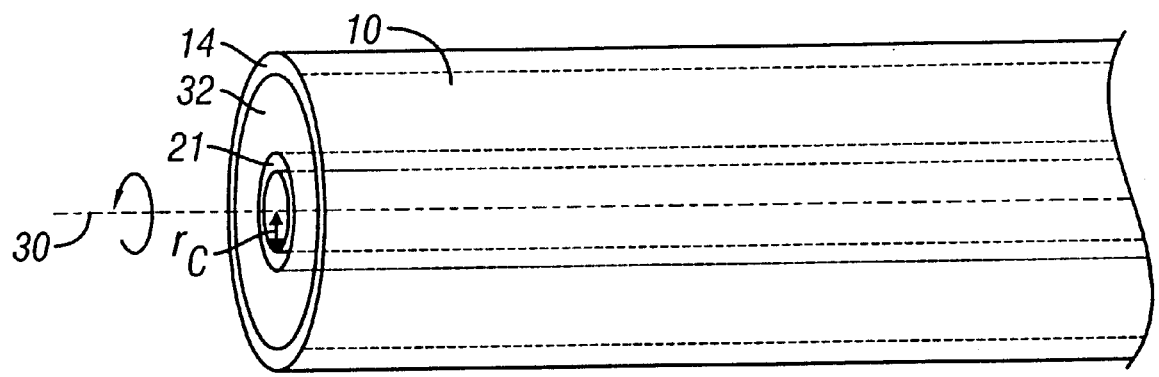
FIGS. 2(a) and 2(b) are perspective and end views of gas containing envelopes showing some effects of envelope rotation.
Figure 2B:
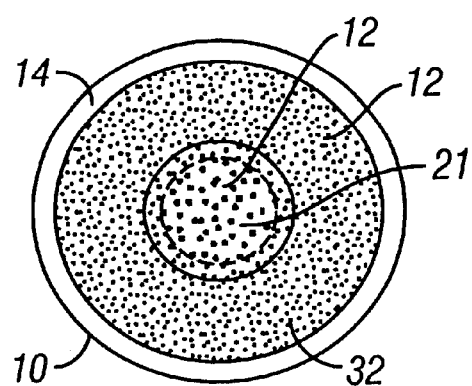

In accordance with the principles of the present embodiments and referring to FIGS. 2(a) and 2(b), a containment envelope 10 having a wall 14 is provided. The inside of the containment envelope 10 contains a plasma forming fill 12 which becomes heated and ionized into plasma when appropriately energized. As a consequence of the rotation of the envelope 10 about an axis 30, a plasma column 21 is formed which is isolated from the wall 14 by a sheath 32 of neutral gases. Localized heating of the fill gas within and adjacent to the plasma column 21 leads to a loss of rigid rotor flow inside some radius $r_c$ defined in the discussion following. Outside the cylindrical surface with radius $r_c$ rigid rotor flow continues to obtain.

In a preferred embodiment, the envelope 10 is a hollow cylindrical tube comprised of fused quartz. However, the envelope 10 can be constructed of a wide variety of other materials including, but not limited to, glasses, metals, ceramics, or composite materials. Also, a wide variety of shapes may be incorporated into envelope design. Further, the containment envelope can be sealed or unsealed, the latter having particular utility for systems requiring an axial flow of gases. The precise selection of materials and envelope dimensions depends on the method of heating and the application and may be determined by one having ordinary skill in the art. For example, if a microwave source is used to energize a plasma within the envelope 10, the envelope needs to be constructed of materials transparent to microwaves. The inventors contemplate the use of a vast array of plasma forming fills including, but not limited to, gases, liquids, vapors and even combinations thereof. It should be noted that even solid materials can be used as plasma forming fill, if means are provided to heat them until they change into vapor form. That means may be radiant heating of the envelope wall by ultraviolet emissions from the internal discharge column, or by external heating of the envelope.

Once introduced into the envelope 10, the fill 12 can be energized to form a plasma. Typical modes of energization include, without limitation, an arc discharge between electrodes, exposure to electromagnetic radiation or chemically induced energization. Energization of the fill 12 results in the formation inside the envelope 10 of a plasma, that is, a hot vapor consisting of both neutral gas and charged particles. The charged particles include electrons and ions, the latter of which may be singly or multiply ionized atoms or molecules. Despite changes in temperature and density caused by energizing the gases in the envelope, pressure equilibrium is maintained and the pressure is substantially the same throughout the inside of the envelope 10. For an open-ended tube atmospheric pressure prevails throughout the tube. As used in this patent, the term energization refers to the multiple steps of breaking down the fill to form a plasma (i.e., ignition), heating of the plasma so formed, and sustaining the plasma discharge in a steady or repetitively pulsed state.

In accordance with the Ideal Gas Law, which for conditions of fixed pressure states that density and temperature vary inversely with one another, the density of hot gas is lower than that of cooler gas. The principles of the present invention take advantage of this difference in density. Rotation of the envelope 10 causes the gases inside the envelope to separate according to density, with the hot, less dense gases collecting in the region surrounding the axis and the cooler, more dense gases moving radially outward to occupy the region near the wall. The central region of hot gases (and plasma, as is explained further on in this paragraph) is referred to herein as a plasma column 21; the region of cooler gases lying between the plasma column 21 and the wall 14 is referred to herein as an annular sheath 32. The low density of the hot gases and plasma in the plasma column 21 is figuratively represented in FIG. 2(a) by a paucity of dots; the high density of the cooler gases in the annular sheath 32 by an abundance of dots. Since the ionization fraction of a gas under the collisional conditions of high pressure is controlled by temperature, the region occupied by plasma is effectively one and the same as that occupied by the hot gas.

With continued reference to FIGS. 2(a) and 2(b), the plasma column 21 of hot gas and plasma produced upon energization of the plasma-forming fill behaves just as air bubble does in water, that is, it has a tendency to rise. The bubble of hot, less dense gases collected in the central column experiences a buoyancy force associated with the difference in specific gravity of the gases in the bubble compared with those in the sheath. But whereas the buoyancy force is independent of position, the centrifugal force increases with distance from the axis of rotation. Therefore, outside some critical radius the value of which depends on the rotation frequency, the centrifugal force dominates over the buoyancy force. So long as the plasma-forming fill is comprised of a single gas such that the variation of specific gravity (i.e., mass density) with radius is only a function of temperature, buoyancy-driven convection is eliminated outside of the critical radius; inside that radius, thermal transport by convection may take place. Thus, rotation of the containment envelope about a horizontal axis creates a stable equilibrium for a central plasma column, so long as the mass density of the energized fill increases with radius from the rotation axis.

In a mathematical representation, the centrifugal force per unit volume is defined as $\rho r \omega^2$ where $\rho$ is the specific density of the gases, r is the distance from the axis of rotation 30 and $\omega$ is the angular rotation frequency of the envelope. The buoyancy force per unit volume is defined as $\rho g$, where $\rho$, again, is the specific density and g is the gravitational acceleration. If the gases inside the envelope may be characterized with a single specific gravity, then the critical radius $r_c$ at which the centrifugal force balances the buoyancy force is independent of $\rho$ and given simply by $r_c = g/\omega^2$. Inside $r_c$ the buoyancy force dominates over the centrifugal force, outside the reverse is true. Thus, rotation of the envelope is effective in suppressing buoyancy-driven radial convective heat transport inside the envelope only when $\omega > (g/R)^{1/2}$, where R is a characteristic radial dimension of the envelope 10.

The formula for the critical radius given above can only be approximate, because radial convective transport inside the critical radius precludes the possibility that rigid rotor flow obtains within this radius. Thus, a mismatch must exist in the rotational velocity of the gas at the interface between the plasma column 21, roughly defined by the critical radius formula above, and the sheath 32. Eddies generated by this mismatch may blur the interface, leading to an effective critical radius that is somewhat larger than that given by the simple formula above. Nevertheless, the basic picture of a central column of hot gas and plasma column 21 surrounded by a sheath of cooler gas 32 is unaltered. Shear flow-generated turbulence and buoyancy-driven radial convection are suppressed in the annular sheath 32; in the plasma column 21, they are not. However, in the absence of high axial flow velocities associated with injected streams of gas, the Reynolds number for the fluid flow in the central column should be much lower than that in the case with the swirl gas method of vortex stabilitization. If laminar flow conditions are maintained, turbulence within the central plasma column may be avoided.

The existence of an annular sheath 32 of colder gas surrounding the plasma column 21 is an important feature for the present embodiment. However, this is possible only when gas pressure is "high." In this context, high gas pressure is any pressure greater than that for which the average distance traveled by a gas or plasma particle between successive collisions is short compared with the thickness of the annular sheath 32. This average distance between collisions is generally referred to as the mean free path, $\lambda$. The density within the containment envelope, n, and the cross section for interaction, $\sigma$, by the relation $\lambda = 1/n\sigma$. Since $\sigma$ has only a weak dependence on temperature, variations in $\lambda$ with operating conditions are essentially determined by density alone. In accordance with the principles of the present invention, what constitutes "high" pressure depends on the rotational velocity of the envelope and the radius of that envelope, since the thickness of the sheath is set by the difference between the radius of the containment envelope and the critical radius for a given rotation speed. For example, at standard conditions of temperature and density (STD) the mean free path in argon is about four microns. Therefore, a sheath with a thickness ten times this value would suffice to "float" a central column of hot gas and plasma within the envelope and thermally isolate the column from the wall of the containment envelope.

An important advantage realized by the embodiments described herein is that the radius $r_c$ of the cylindrical surface enclosing the plasma column 21 (the cylindrical surface that confines longitudinal oscillations in the plasma column) may be controlled by varying the rotational frequency $\omega$ of the containment envelope 10. With applied electric field, energy dissipation with the plasma column tends to be greatest where the temperature is highest. This feedback mechanism leads to a situation in which regions already hot, get hotter. Under such conditions, increasing the singe parameter of rotational frequency reduces either the diameter of the plasma column 21 itself or the amplitude of wave-like oscillations of the plasma column 21 about the rotation axis 30. The mean free path imposes a limit on the minimum achievable diameter beyond which a further increase in the rotation frequency produces no effect. The mean free path inside the plasma column is more than an order of magnitude greater than that in the sheath, because of the low density of the heated gas and plasma on axis. For a temperature of 1 eV and atmospheric pressure, the mean free path in argon is roughly 150 microns. Larger plasma columns (e.g., 100 mm columns) are also achievable, the chief restriction being the diameter of the containment envelope. In short, the present invention contemplates embodiments for the formation of stable plasma columns ranging in diameter up to the smallest cross sectional diameter of the containment envelope.

While the above embodiments are described as employing an axis of rotation that is horizontal, it is also contemplated that other embodiments will employ an axis of rotation that is off-horizontal. Elevating the axis of rotation off horizontal has the effect of creating a natural convection in the axial direction of the heated gases in the plasma column. With increasing elevation angle, the axial flow becomes stronger and more sheared in the radial direction. Rotation of the containment envelope makes it possible, nevertheless, to maintain an annular sheath of neutral atoms which both center the plasma column and provide thermal and electrical isolation of it from the wall of the containment envelope. Because the axial flow of heated gas entrains and transports the plasma, the embodiment with a rotation axis off horizontal may be described as a plasma chimney. When the Reynold's Number for the convective flow velocity in the axial direction exceeds the threshold for onset of turbulence, laminar flow will no longer obtain and the thermally insulating property of the annular sheath will begin to degrade.

Figure 3:
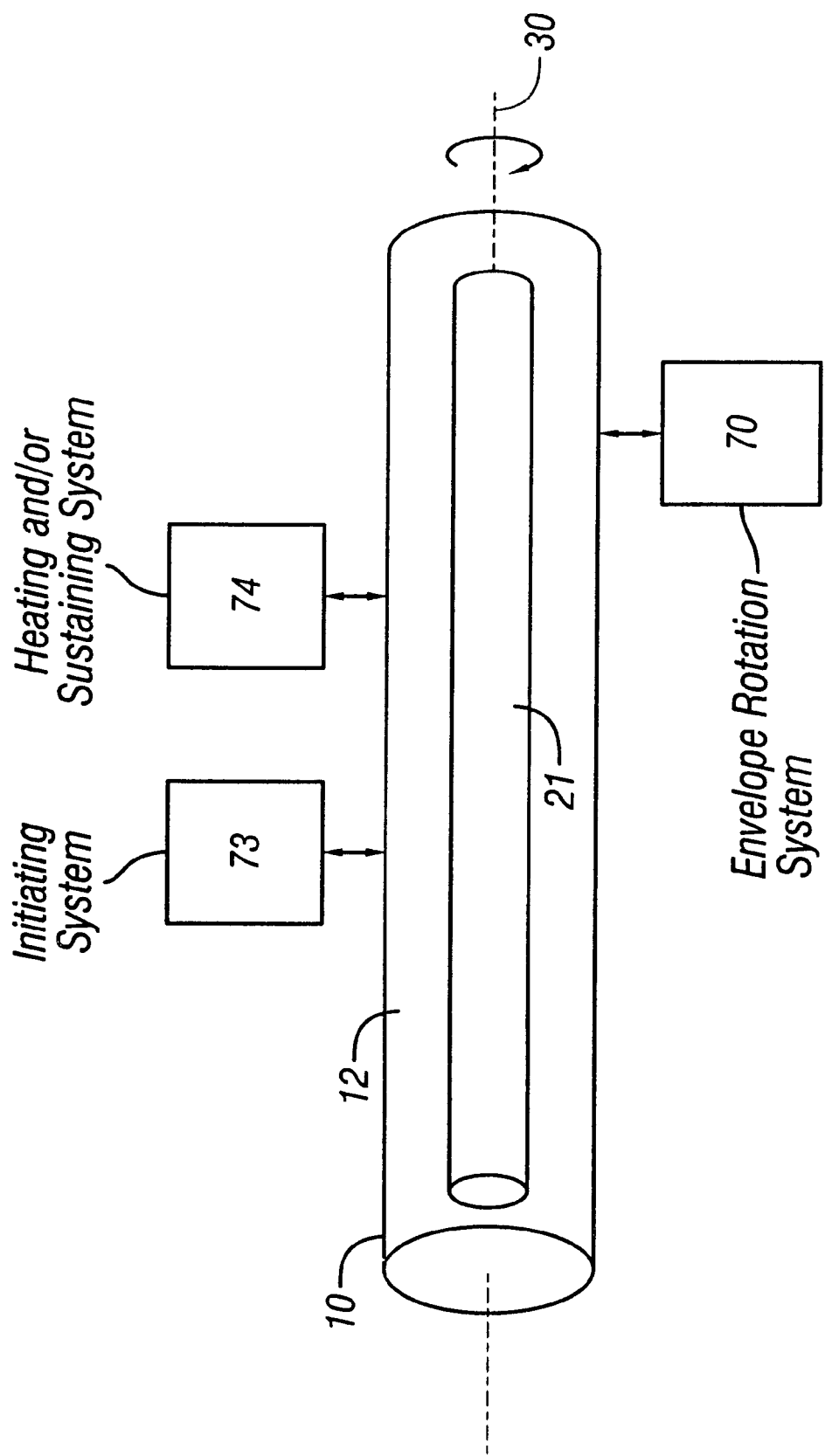
FIG. 3 is a schematic which illustrates the generic features common to most of the embodiments described herein.

FIG. 3 is a schematic block diagram which illustrates the generic features common to most of the embodiments described herein. Included are i) a containment envelope 10 which contains therein a plasma-forming fill 81, ii) means 70 for rotating the containment envelope 10 about a horizontal, or substantially horizontal axis 30, iii) means 73 for initiating a discharge, that is, achieving "breakdown" or "ignition," in said plasma-forming fill, and iv) means 74 for heating and sustaining the resulting plasma in a steady state or pulsed manner. Furthermore, the rotational frequency of the envelope 10 must be sufficiently high that the plasma induced by energizing means 73 and 74 is confined inside a plasma column 21, the surface of which does not intersect the wall of the containment envelope. An exception to the class of embodiments represented in FIG. 3 is the embodiment described earlier as a plasma chimney, in which the axis of rotation is elevated with respect to the horizontal.

As discussed previously the embodiments can include containment envelopes 10 with a variety of sizes, shapes and materials chosen in accordance with the needs of the user. Satisfactory envelope materials include, without limitation, glass, metals, ceramics, or composite materials. The size and shape of the containment envelopes may encompass a wide variety of shapes, e.g., open-ended tubes, sealed bulbs (such as those used in lamps), or irregular shapes (such as the one shown in FIG. 9(*a*)). The only real limitation on the size of the containment envelope is that the minimum dimension perpendicular to the rotation axis be larger than the radius of the plasma column 21 contained therein. The plasma-forming fill 12 can comprise nearly any ionizable material, with the particular needs of the system dictating the precise choice of material. The fill can be a gaseous, liquid or solid material, with the mass of the latter of the latter two preferably small enough that the energy input to the discharge is sufficient to convert that material into vapor form. Preferred gases include air, xenon and argon. Additionally, the plasma-forming fill can include more than one material, for example, prepared gas mixtures used in lasing media, waste materials, and the combination of rare gases with optical dopants like lithium, sodium and sulfur.

The envelope rotation system 70 may include a number of means for rotating an envelope 10 as known to those having ordinary skill in the art. One preferred means for rotating the envelope 10 includes a variable speed electrical drive motor operatively connected to the envelope 10, for example, using a drive belt. A large variety of other rotating means are also contemplated by the inventors as being within the scope of the invention.

The plasma-forming fill 12 can comprise nearly any ionizable material, with the particular needs of the system dictating the precise choice of material. The plasma-forming fill 12 can be a gaseous, liquid or solid material, with the liquid and solid materials being convertible into vapor, preferably using energy input by the energizing means 73 or 74. Preferred plasma-forming fills 12 include, without limitation, air, xenon, and argon. Additionally, the plasma-forming fill 12 can include more than one material or be supplemented with additional materials, for example, waste materials, combinations of rare gases with optical dopants like lithium, selenium, sodium and sulfur.

Energization of the plasma may be accomplished by a variety of methods, including without limitation, electrical arc discharge between electrodes, chemical reaction between reactive components contained within the envelope, or discharge induced by the use of electromagnetic radiation, such as microwaves, radio frequency waves, light waves, or other methods known to those having ordinary skill in the art. As stated earlier, the term energization encompasses both the means 73 for igniting a discharge in the plasma-forming fill and the means 74 for heating the resulting plasma and sustaining it in a steady state or pulsed manner. Different methods, e.g., electrical and electromagnetic radiation, may be combined in a single embodiment, with one method preferably used for ignition and the other method for heating and sustaining the plasma column, or one method used for ignition and a combination of methods used for heating and sustaining the plasma column.

FIG. 4(*a*) illustrates an ordinary arc discharge 41 between a pair of electrodes 42 in ambient air. To create such a discharge, an electrical potential is applied between the pair of electrodes 42 with an high voltage power source 43. The luminous path of such an arc discharge 41 is convex upward in shape, as suggested by the name "arc." By rotating the containment envelope 10 as previously described with respect to the embodiment shown in FIGS. 2 and 3, arc discharges 41 are produced which are virtually straight lines. Rotating the containment envelope confers the further advantage that the straight arcs therein may be made quite long, for example, the gap X between the electrodes 42 may be several meters long.

One particular embodiment is illustrated in FIG. 4(*b*). A cylindrical envelope 10 is provided which, by way of example, may be formed of a fused quartz cylinder having an inside diameter of 48 mm, a wall thickness of 2 mm and length of 1.2 m. Two electrodes 42, a first electrode 42*a* and a second electrode 42*b*, are mounted along the horizontal rotation axis 30 from opposite ends of the containment envelope 10, with one or both electrodes configured to retract axially while co-rotating with the envelope. In the preferred embodiment shown in FIG. 4(*b*) the second electrode 42*b* is configured to retract axially in the direction given by the arrow A, whereas the first electrode 42*a* is fixed in the axial direction. The electrodes 42 are preferably constructed of a refractory metal such as tungsten (W) with a diameter of about 1.5 mm and a length of about 50 mm.

In order to generate an electrical potential between them, the electrodes 42*a* and 42*b* are electrically connected to a power source 43 by means of electrical brushes 45 which contact the electrically conducting end caps 44. These end caps co-rotate with the envelope and provide support for the fixed electrode 42*a* and the retractable electrode 42*b*, the latter by means of the sliding arm 46 to which electrode 42*b* is mounted. The envelope 10 is purged with a gas fill 12, preferably a noble gas like argon or xenon. The purge gas is fed through a gas feed tube 47 at slight positive pressure into the gas feed chamber 49 enclosed between the end cap 44 and the cup 48, the latter making a sliding seal against the end cap 44. Passage through the holes 50 in the co-rotating end cap 44 brings the purge gas into co-rotation with the containment envelope 10. Alternatively, if the end caps make gas-tight seals to it, the envelope may be charged with a gas fill 12 at pressures ranging from sub-atmospheric to super-atmospheric. The envelope is supported, for example, on a pair of bearings 66 which allow rotation of the envelope 10 by a rotating means 70 comprised, for example, of a motor 71 and a belt 72.

With the points of the electrodes close together or touching, high voltage is used to ignite an arc between them. In the embodiment depicted in FIG. 4(*a*), a current-regulated direct current power source 43 with a maximum output voltage of 6 kV is sufficient to ignite an arc if the electrodes are less than 5 mm apart. The magnitude of the electrical potential required to sustain the discharge is determined by a variety of factors including the nature of the plasma forming fill 12, the pressure of the fill, the rotational frequency of the containment envelope 10, the magnitude of the arc current, and the distance between the electrodes following their separation. One example of the embodiment pictured in FIG. 4(*a*) uses an argon fill 12 at atmospheric pressure, a rotational frequency of 3,000 rpm, an arc current of 1 amp, and a final separation between electrodes of 1 m. Only 500 volts is required to sustain this discharge. The luminous diameter of the plasma column produced in this manner is less than 5 mm.

Other examples of the embodiment have utilized 60 Hertz alternating current (supplied from high voltage transformers with magnetic shunts) both to ignite and to sustain the arc. Because the arc plasma nearly extinguishes at each zero crossing of the alternating current waveform, a significant fraction of the available power during each half cycle is utilized to reheat the plasma.

Figure 4C:
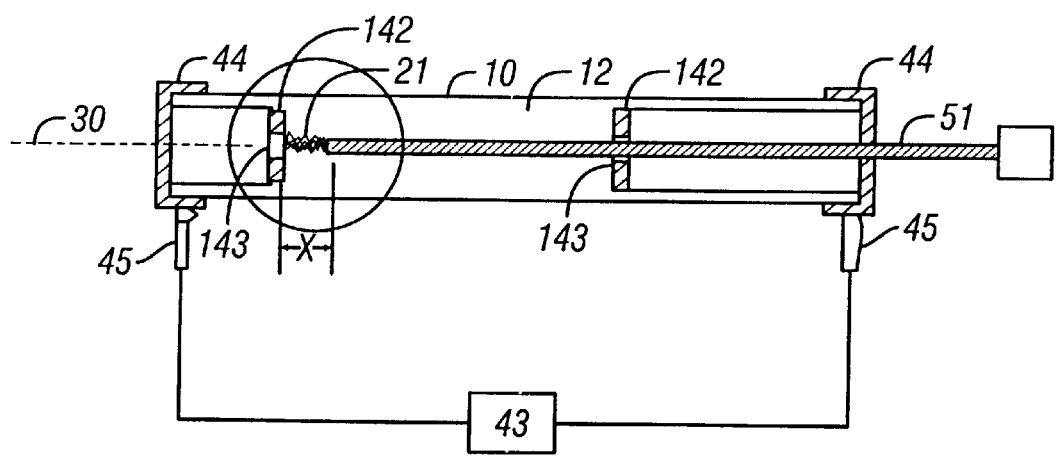

In the embodiment represented by FIG. 4(b) the tips of the electrodes 42 are immersed in the hot plasma of the central plasma column 21 and, consequently, subject to melting, vaporization and erosion when the arc current is high. In applications which require generating a vapor rich in one of the constituent elements of the electrode, locating the electrodes on axis and, thereby, exposing the electrodes to high heat load can be advantageous. If, on the other hand, elements from the electrode constitute undesired contamination of the fill gas 12, the electrodes 42 may be located outside the radius of the plasma column 21, as illustrated in the embodiment represented by FIG. 4(c). Alternatively, it may be desirable in some applications to locate one electrode on the axis 30 and to locate the other outside the radius of the plasma column 21.

With continued reference to FIG. 4(c), each electrode is in the form of a ring 142 with an opening 143 larger than the outside diameter of the plasma column 21. Alternatively, each electrode may be a single straight rod positioned off axis. As taught in the embodiment illustrated in FIG. 4(a), the ring electrodes 142 are preferably fabricated of a refractory material such as tungsten and supported off the end caps 44 at opposite ends of the envelope 10. To draw an arc between the axially separated electrodes, a co-rotating, electrically conducting rod or tube 51, which initially bridges the two electrodes, is pulled out one end of the envelope. As the striking rod 51 is removed, the arc spanning the gap X between it and the first ring electrode 142 lengthens. Once the arc bridges both electrodes 142, the striking rod 51 can be fully removed from the envelope 10. Alternatively, the electrodes may be made axially retractable, as illustrated in FIG. 4(b), and an arc may be struck with the two electrodes close together or touching. In the embodiment illustrated in FIG. 4(c) but not shown, the envelope is supported on bearings which allow rotation of the envelope 10 by some rotating means and the electrodes are electrically connected to a power source by means of electrical brushes contacting the end caps.

Figure 4D:
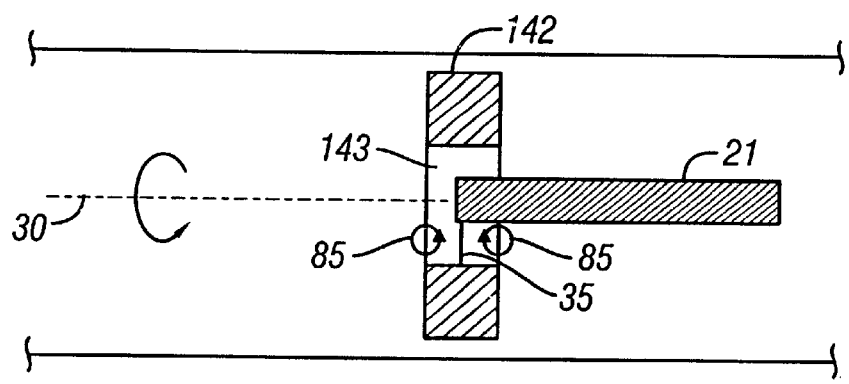
Figure 5A:
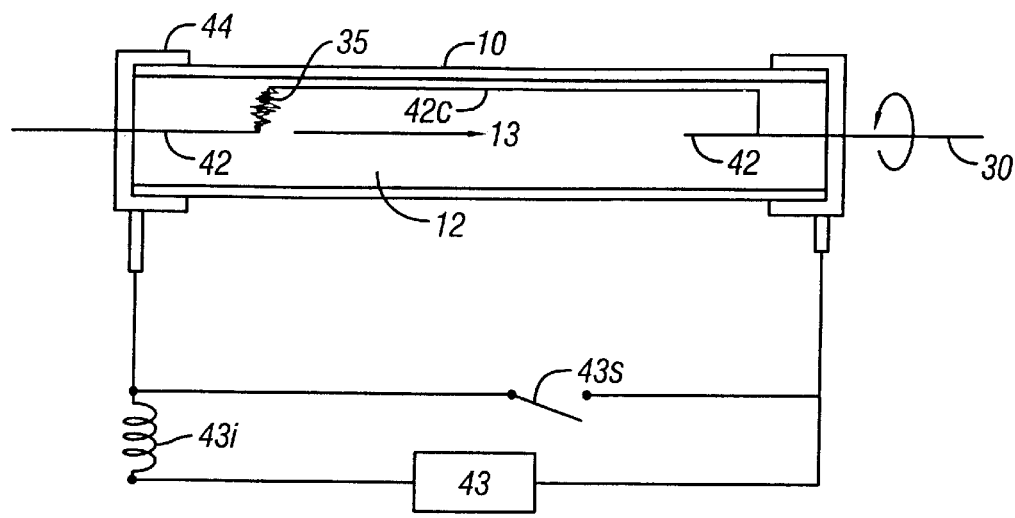
FIGS. 5(a–d) are a sequence of side views of an embodiment illustrating how non-mechanical means can be employed to elongate the discharge.
Figure 5B:
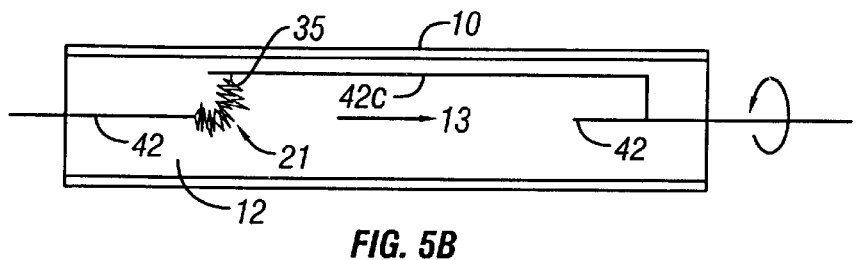
Figure 5C:
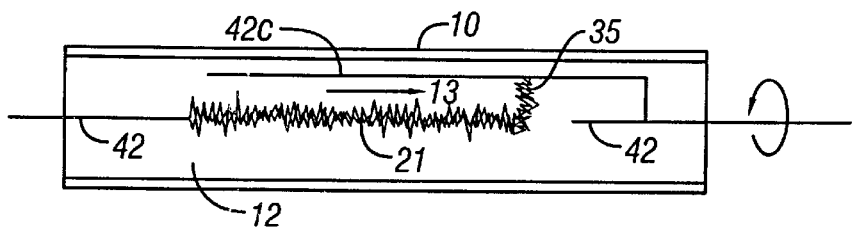
Figure 5D:
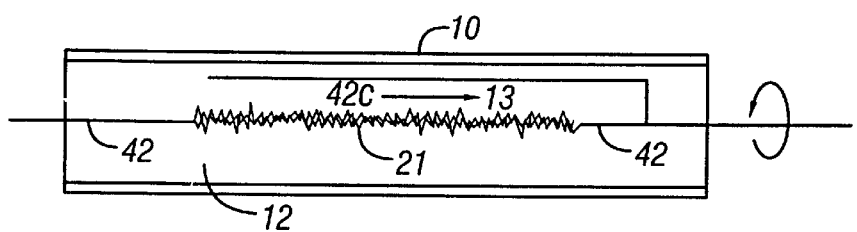

FIG. 4(d) is a close up view of the circled portion in FIG. 4(c) containing the plasma column 21 and one ring electrode 142. The discharge path in the vicinity of each ring electrode 142 consists of two distinctly different plasma regions: the central plasma column 21 and a radial segment 35 lying between the electrode ring 142 and the surface of the plasma column 21. Because the gas outside the central plasma column is cold and therefore electrically resistive, the voltage drop per unit distance is much higher across the radial segment 35 of the discharge path than along the axial plasma column 21. The gases heated by the corona-like discharge in the radial segment 35 are driven toward the central column by the artificial gravity created by rotation of the envelope, as taught earlier in this patent. This inward convection creates a dipole-like convective flow 85 which cools the surface of the ring electrode 142. Since the ring electrode 142 co-rotates with the envelope, the pattern of convective flow 85 is stationary in the rotating frame of the envelope. The cooling effect of the convective flow 85 reduces the temperature rise of the electrodes 142 compared with that of axial electrodes (see FIG. 4(b)) immersed in hot plasma. As a result, electrode life is extended. However, this natural cooling does not eliminate sputtering processes by ions accelerated by the electrostatic potential across the radial gap between the ring electrodes 142 and the plasma column 21.

In the embodiments illustrated in FIGS. 4(b) and 4(c), ignition of the discharge is achieved with the tips of the electrodes close together; the resulting arc is then elongated by mechanically retracting a co-rotating electrode (FIG. 4(b)) or withdrawing a co-rotating rod (FIG. 4(c)). An alternative embodiment is illustrated in FIG. 5, which permits elongating the arc without mechanical movement of any component inside the discharge tube. The right electrode 42 is electrically extended in the direction of the left electrode 42 with a wire 42c lying against the wall of the containment envelope 10. With application of a sufficiently high voltage an arc 35 is struck across the gap between the left electrode 42 and the tip of wire 42c. Since the discharge requires considerably lower voltage to sustain than to ignite, the cost of the power supply system may be minimized by using a fast-opening switch 43s in parallel with a low voltage, dc power supply 43 series-connected to a large inductor 43i.

Elongation of the arc is achieved by creating a convective flow 13 of gas in the axial direction. The flow 13 may be driven by an external source of gas at positive pressure or by tilting the rotation axis 30 of the containment envelope 10 off horizontal (neither of which means for inducing said flow 13 is shown in FIG. 5). Forced or natural convection of gas in the axial direction causes the electric arc 35 to bow out in the direction of the flow 13. The plasma and heated gas in the portion of the arc closest to the axial electrode will be forced toward the axis 30 of the rotating containment envelope 10, while the point of contact of the arc with wire 42c will travel in the direction of the convective flow. FIGS. 5(a–c) illustrate in snapshot fashion the manner in which the axial plasma column 21 elongates to the right until it contacts the right electrode 42 in FIG. 5(c). In its traversal down the length of the containment envelope under the influence of convective flow 13, the movement of the L-shaped arc in the rotating containment envelope resembles, except for the matter of direction, the behavior of an arc in a Jacob's Ladder.

Embodiments with hollow electrodes may be used as light sources with various purposes: for example, intense ultraviolet light sources, bright spectral emission lamps for use in analytic chemistry, light sources for atomizing or exciting unknown samples in atomic emission spectroscopy, and sources of general illumination.

Figure 6:
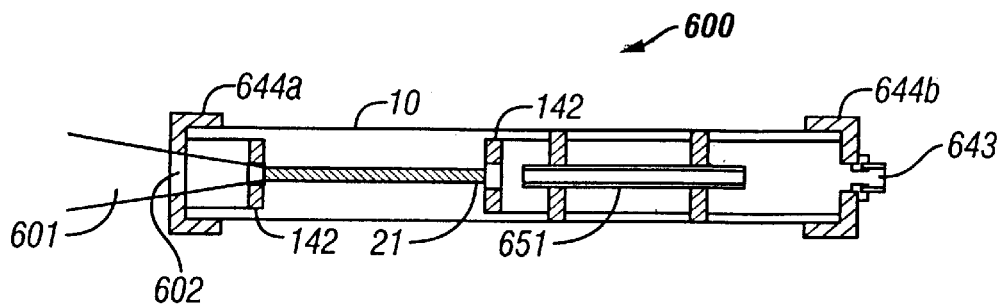
FIG. 6 is a side view cross-section of the embodiment described in FIG. 4(c) with adaptations for application as an intense ultraviolet light source, a spectral lamp of the elements and a light source for exciting unknown samples in atomic emission spectroscopy.

FIG. 6 illustrates one light source embodiment 600 which includes a containment envelope 10, sealed at opposite ends by a first and a second end cap 644a, 644b and having therein a pair of ring electrodes 142 and a plasma column 21. The light source 600 can be electrically powered and connected in a manner discussed with respect to FIGS. 4(b) and 4(c). The plasma column 21 produces light, including a light beam 601 which is projected through a light transmissive window 602 in the first end cap 644a positioned at a first end of the envelope 10. The second end cap 644b, positioned at an opposite second end of the envelope 10, can include a pump-out fitting 643 which permits evacuation of the containment envelope 10 and subsequent backfill with a gaseous plasma-forming fill 12 at sub-atmospheric or super-atmospheric pressure. An arc may be initiated between the electrodes 142 using, for example, a striking rod 651 (shown in retracted position). The striking rod must be translated with means external to the containment tube, such as a magnetic actuator, to transfer the arc to the electrode 142 attached to the second end cap 644b. Once a discharge has been ignited, the striking rod must be retracted from between the two electrodes 142. A particular advantage of the present light source 600 is the axial transmission of a light beam 601 from a long column of emitting atoms or ions.

In other light source embodiments it is advantageous to use a heavy, non-reactive gas such as xenon as fill gas 12. Xenon is advantageous, both because of its high atomic weight (131 Atomic Mass units (AMU)) and its low thermal conductivity (one fifth that of air). In this embodiment, when plasma forming fills comprised of elements with atomic weight less than 131 AMU are introduced into a rotating envelope 10 containing xenon, such plasma forming fills are confined near the axis of rotation 30 by centrifugal forces, as taught earlier in this patent. Examples of such plasma forming fills include, but are not limited to, popular spectroscopic elements like sodium, iron, nickel, copper, and cadmium. The fact that the elements lighter than the fill gas 12 accumulate within the plasma column 21 of a light source embodiment means that the spectral intensity of such light sources will be enhanced over other light sources in which sample elements rapidly diffuse out of the excitation zone.

Figure 7:
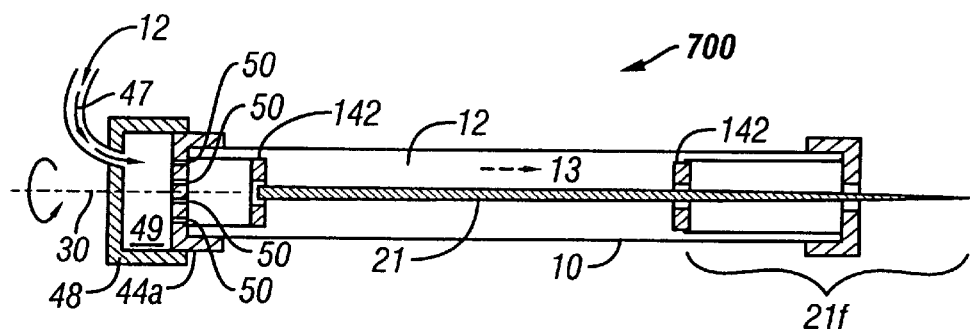
FIG. 7 is a side view of the embodiment described in FIG. 4(c) with adaptations for application as a plasma torch.

The embodiment of FIG. 7 illustrates a plasma torch 700 constructed in accordance with the principles previously disclosed herein. The plasma torch 700 includes many of the same elements as the embodiment depicted in FIG. 4(c). As in FIG. 4(c) but not shown here, an electrical potential is applied across the ring electrodes 142 to form a current-carrying plasma column 21 and the envelope 10 is rotated about a horizontal, or substantially horizontal rotation axis 30. Additionally, a convective flow 13 is used to produce a non-current-carrying plasma flame. One way of achieving axial gas flow is by introducing a gaseous plasma forming fill 12 at positive pressure through a first end cap 44a. To bring the flowing gas into co-rotation with the envelope it is desirable to enhance the momentum transfer to the gas over that which would occur solely by interaction of the gas with the walls of the containment envelope 10. In the preferred embodiment shown in FIG. 6 auxiliary means for inducing rigid rotor flow are provided in the form of a gas feed chamber 49 defined by an outer end cap 48 and a plurality of collimating holes 50 in the first end cap 44a. Another auxiliary means for enhancing gas rotation can also be a "honeycomb" collimator, or other devices known to those having ordinary skill in the art.

The plasma torch embodiment 700 may be employed in all the usual applications for which such torches are used, for example, flame spray deposition of metals, dielectrics, ceramics, or metal matrixes. Other useful applications are discussed in the previously referenced article authored by M. I. Boulos. Advantageously, the small flame diameter and precise positioning possible with the torch embodiment 700 make it attractive for cutting and drilling applications.

Figure 8:
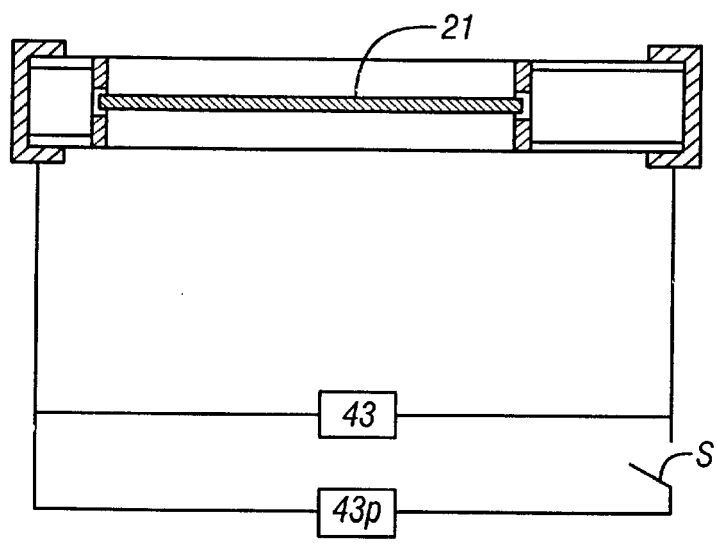
FIG. 8 is a side view of another plasma torch embodiment in which pulsed electrical energy is used to raise the temperature in the plasma column transiently into the kev regime.

With reference to FIG. 8 another particularly advantageous embodiment includes a power source 43p capable of supplying pulsed electrical energy to the pictured embodiment. In a preferred embodiment, the pulsed power source 43p is connected in parallel with the dc power supply 43, with suitable diode circuitry to protect the dc supply against damage from excessive voltage. For example, a capacitor bank or transmission line can be used as a pulsed power source 43p. Following formation of a plasma column with the continuous dc supply 43, the pulsed power source 43p is discharged through a fast-closing switch S, causing an high current to flow through the plasma column 21. If the current rises so fast that it does not have time to "soak in" radially, a skin current will be produced on the surface of the plasma column with an associated magnetic field that pinches the annular current distribution toward the rotation axis. Such magnetic compression can easily generate temperatures in the 5–100 keV region, sufficient to excite K-line, X-ray emission from the elements confined in the plasma column 21. The plasma column 21 can also be transiently heated using a high power, pulsed laser. Other modes of heating are discussed in the Handbook of vacuum Arc Science and Technology; Ed. by R. l. Boxman, P. J. Martin, and D. M. Sanders (1995), especially the Chapter entitled "Pulsed Power Application" the entirety of which is hereby incorporated by reference.

An important feature conferred by varying the rotational frequency ω of the containment envelope 10 is control of the radius of the cylindrical surface enclosing the plasma column 21. The radius of said cylindrical surface decreases with increasing rotational frequency ω if two conditions are fulfilled: i) a local thermodynamic equilibrium exists in the plasma column 21 (that is to say, the ionization fraction is determined by the local temperature in accordance with the well known Saha Relation) and ii) the means of heating concentrates the deposited energy where the plasma is hottest. For the embodiments shown in FIGS. 4(b) and 4(c), both conditions are realized. For electrically heated plasmas in general, the current density and ohmic dissipation tend to be greatest where the temperature is highest. For example, at temperatures ranging from 0.2 eV to 2.0 eV, the fractional ionization of argon gas at atmospheric pressure changes from less than one part in $10^{-4}$ to unity. This dramatic change in the number of available current carriers leads to a strong increase in conductivity in the plasma column 21, with the result that regions already hot, get even hotter. Such is not the case when the temperature is low and the ionization fraction is controlled by electric field rather than plasma temperature. At low power densities, the voltage drop per centimeter is in the kilovolt range. In such coronalike discharges, the coupling between temperature profile and heat deposition profile is much weaker.

Figure 9A:
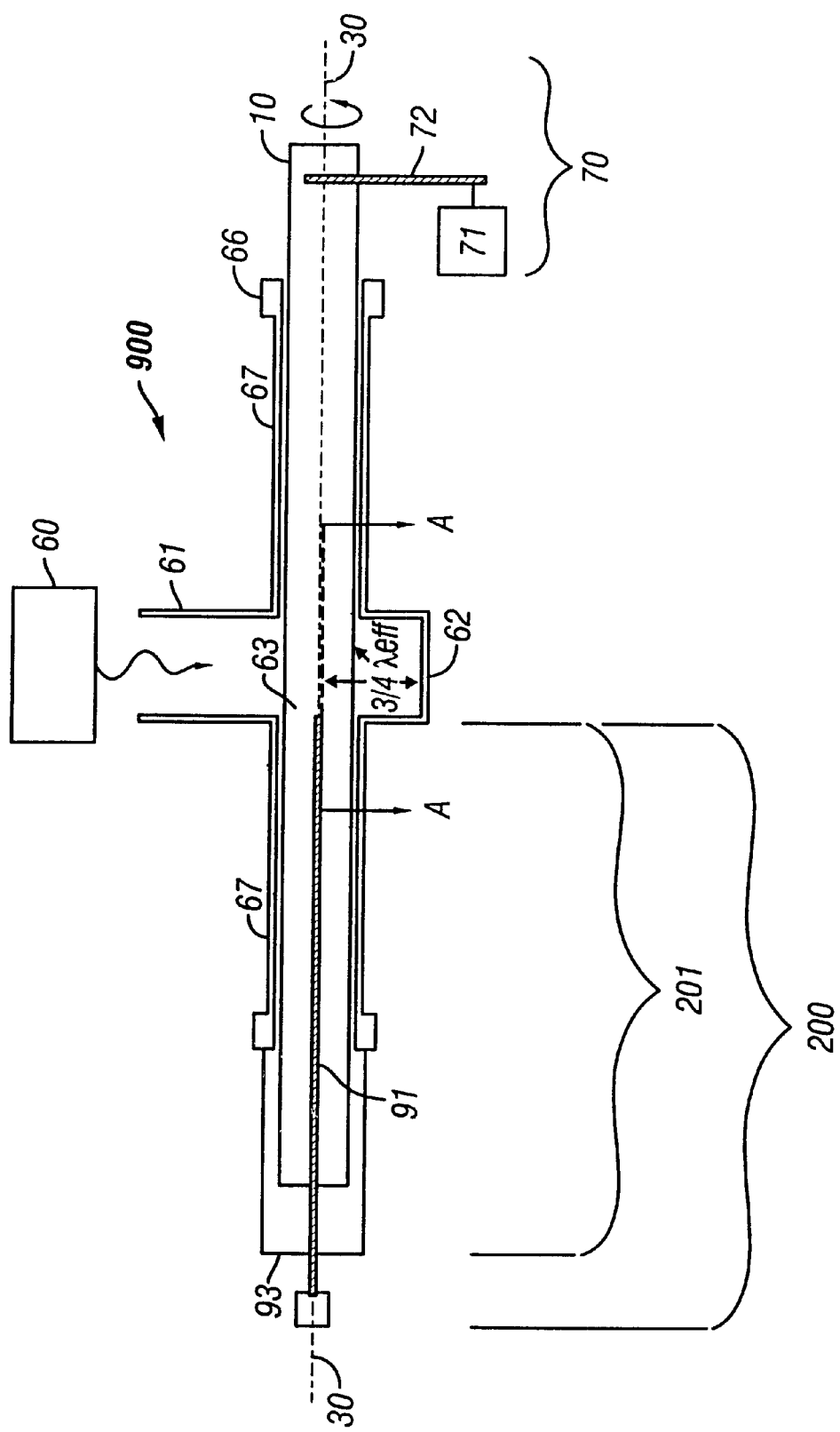
FIGS. 9(a), 9(b) and 9(c) are sectional side, close-up partial section and A—A section views, respectively, of an embodiment powered by microwaves.

Other preferred embodiments utilize electrodeless methods for energizing the discharge. One preferred embodiment 900 is illustrated in FIG. 9(a). As with the previously discussed embodiments, embodiment 900 includes a containment envelope 10 containing therein a plasma forming fill 12. The envelope is rotated about a horizontal, or substantially horizontal rotation axis 30 by a rotation system 70, the nature of which has been well described herein. The pictured embodiment further includes a microwave source 60 as a means for both initiating and sustaining the discharge. A satisfactory microwave source is, for example, a 2.45 GHz continuous wave, 30 kW magneton power supply such as that manufactured by Microdry Corp. Other examples include microwave sources at ISM (Industrial Scientific Medical) standard frequencies, including but not limited to 896 MHZ and 950 MHZ. The latter frequencies are advantageous, because high power magnetron sources operating at these frequencies can be obtained inexpensively from commercial vendors. In the pictured embodiment the envelope 10 is supported, for example, on a pair of bearings 66 which allow rotation of the envelope 10 by a rotation system 70 comprised, for example, of a variable speed AC motor 71 and a drive belt 72.

Microwaves generated by the power source 60 are introduced into a shorted section of waveguide 61 (e.g., a WR430 waveguide) so as to produce a standing wave pattern with an effective wavelength between nodes of $\lambda_{eff}$, measured along the axis of the waveguide 61. The rotation axis 30 of the envelope 10 is positioned transverse to the axis of the waveguide 61, at the location of an anti-node in the standing wave pattern. In the embodiment depicted in FIG. 9(a) the rotation axis 30 is positioned at a distance of ¾ $\lambda_{eff}$ from the shorted end 62. Openings 63 in the broad-sided wall of the rectangular waveguide 61 permit the envelope 10 to pass through.

In another aspect of the embodiment 900 illustrated in FIG. 9(a), electrically conductive sleeves 67 surround the envelope 10. These sleeves 67 serve as shields against radiation leakage out of the openings 63 in the waveguide 61. A preferred embodiment includes aluminum sleeves 67 having an air gap less than two mm (millimeters) wide between the envelope 10 and the encircling sleeve 67. Rotation of the envelope 10 inside close-fitting stationary sleeves 67 leads to efficient heat transfer between the envelope 10 and the sleeves.

A further aspect of the embodiment shown in FIG. 9(a) includes a resonant coaxial cavity 200 attached to the left side of waveguide 61. The resonant coaxial cavity 200 serves as a means for igniting a plasma in the plasma forming fill 12. This is illustrated in greater detail in FIG. 9(b). Other satisfactory means for plasma ignition are known to those practiced in the art of rf and microwave discharges.

Figure 9B:
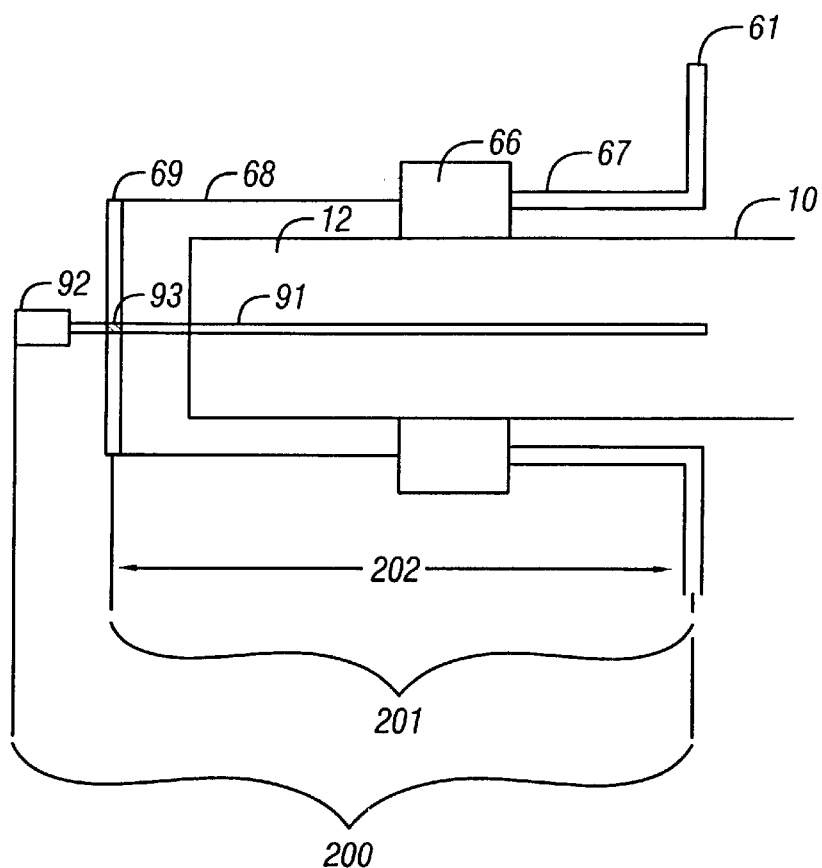

Referring to FIG. 9(b) a resonant coaxial cavity 200 is shown. The cavity 200 includes an outer conducting shell 201 (comprised of elements 67, 66, 68, 69) and a center conductor 91. The outer conducting shell 201, which extends from the shorted wave guide 61 to an end piece 69, has a length 202 equal to an integral number N of vacuum half wavelengths $\lambda_{\mathit{eff}}/2$ of the microwave radiation (in a preferred case, 2.45 GHz). The outer conducting shell, in a preferred embodiment, includes a conducting sleeve 67, a bearing ring 66, and a conducting extension piece 68 terminating in a conducting end piece 69. A satisfactory embodiment includes an aluminum sleeve 67 with a cylindrical extension piece 68 formed from copper screen wrapped around the bearing ring 66 with a brass disk forming the end piece 69. The end piece 69 includes an opening 93 therein surrounded by close-fitting rf finger joint material enabling a center conductor 91 to be completely retracted with negligible leakage of microwave radiation. With continued reference to FIG. 9(b) a satisfactory center conductor 91 comprises, for example, a stainless steel weld rod 3 mm in diameter having a pointed tip at one end, and a thermally and electrically insulated handle 92 at the other end. The handle 92 facilitates convenient removal of the center conductor 91 from the outer conducting shell 201 once the fill gas 12 has been ignited.

In this embodiment plasma ignition is achieved by turning on the microwave power supply 60 at a power setting of several kilowatts, and then withdrawing the tip of the center conductor 91 past the side wall of the waveguide 61. Generally, a popping sound is audible when the plasma forming fill 12 breaks down (i.e., forming plasma). Once ignited, the discharge may be sustained with microwave power of less than one kilowatt.

The center conductor 91 is withdrawn completely after ignition, to prevent it from heating up excessively. Without the center conductor 91 present, the outer conducting shell 201 no longer encloses a resonant microwave cavity and microwave energy cannot propagate in coaxial mode down the sleeve 67 any farther than the plasma column 21 extends into the sleeve.

Figure 9C:
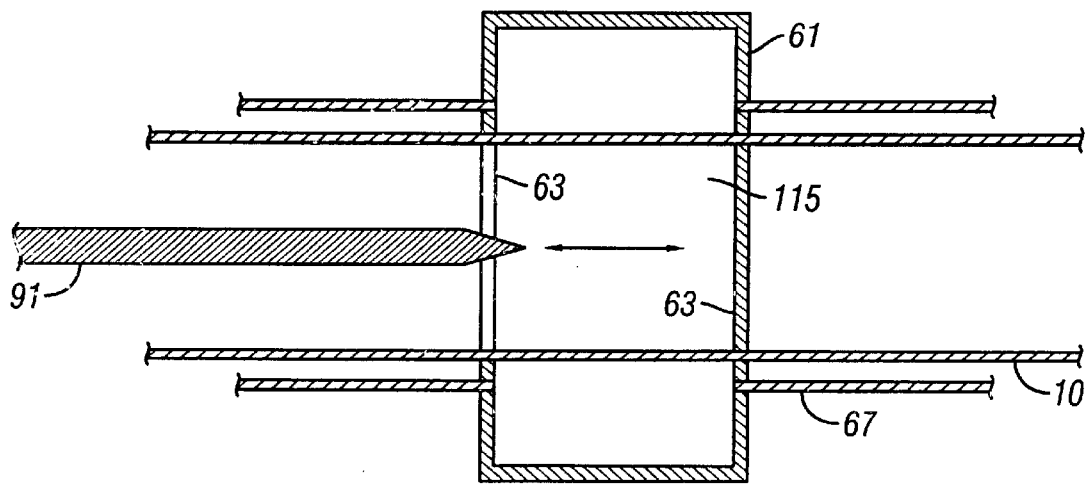

FIG. 9(c) is an enlarged cross-sectional view of FIG. 9(a) along cut A—A. The envelope 10 passes through the waveguide 61 at openings 63 in its side walls. The bearings 66 (not shown) hold the rotating envelope 10 in position. The double-sided arrow 115 indicates the direction of the oscillating electric field associated with the $TE_{10}$ fundamental mode for transmission of the transverse electric wave inside the waveguide.

Figure 10A:
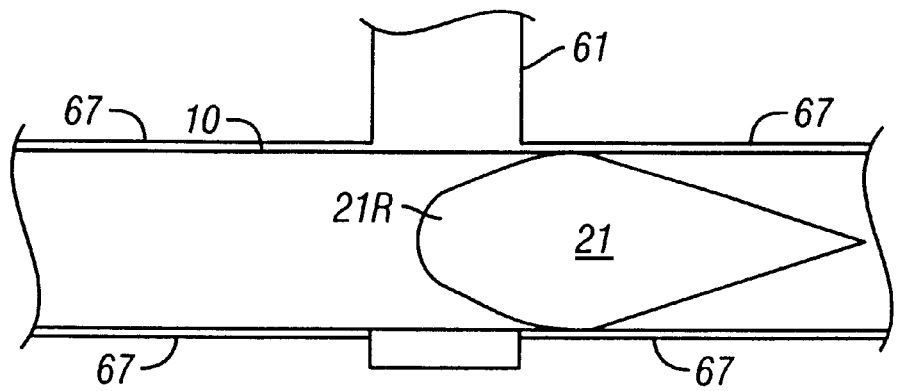
FIGS. 10(a), (b) and (c) are cross-sectional cuts through the containment envelope which reveal the different shapes of the plasma plume produced in the absence of axial gas flow.
Figure 10B:
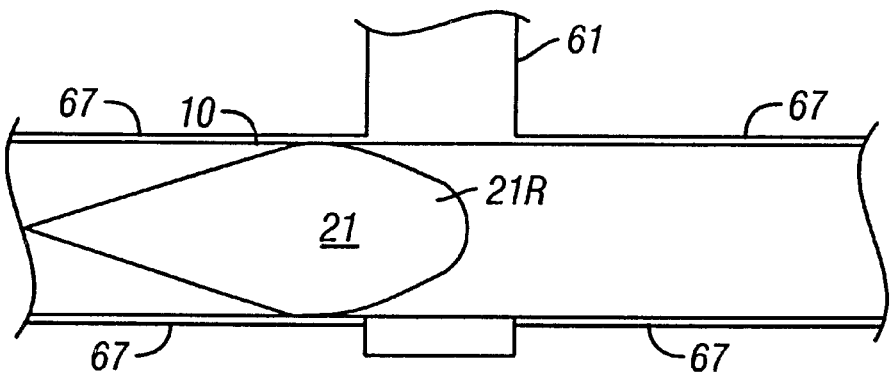
Figure 10C:
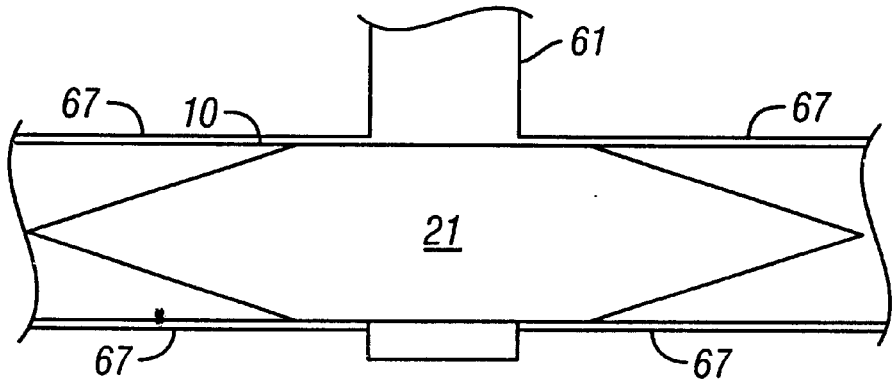

After ignition, the plasma column 21 in embodiment 900 takes one of the three elongated shapes illustrated in FIGS. 10(a)–10(c). For example, the shape of the plasma column 21 may be that of a single-ended flame pointing to the right (FIG. 10(a)), a single-end flame pointing to the left (FIG. 10(b)), or a double-ended flame pointing to both the right and left of the waveguide 61 (FIG. 10(c)). For the single-ended flames (FIGS. 10(a) and 10(b)), the plasma column is described by a surface of revolution with a blunt end or root 21R located in the center of the waveguide 61. From a diameter of less than 2 cm at its root 21R, the plasma column expands with axial distance to fill, or nearly fill the envelope 10 before tapering down to a point about 5–10 cm from the wall of the waveguide 61. The maximum diameter of the plasma column lies about 3 cm from the wall of the waveguide 61. The fact that the plasma column 21 is brightest where its diameter is greatest (inside the aluminum sleeve 67) suggests that the microwave energy couples to the plasma column 21 predominately in the sleeve 67, not in the waveguide 61. For this to occur, the microwaves must mode-convert from the transverse electric wave inside the waveguide 61 to a coaxial wave inside the aluminum sleeve 67. Presumably, the plasma column 21 itself serves as the central conductor for coaxial wave transmission along the axial direction inside the aluminum sleeve 67. The appearance of the discharge column may be altered by introducing a flow of gas along the axis of the envelope as will be described later.

Figure 11:
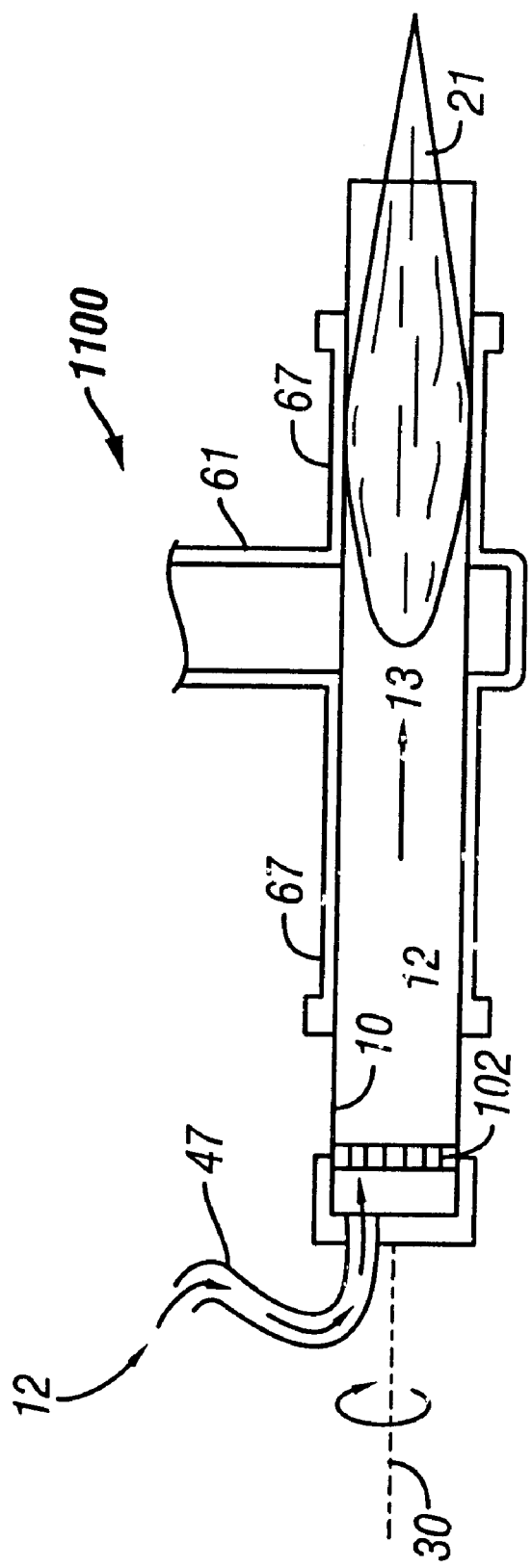
FIG. 11 is a cross sectional view through the containment envelope of the microwave-powered embodiment showing the effect of an axial gas flow on the plasma flame.

FIG. 11 illustrates a plasma torch embodiment 1100 of the electrodeless, microwave discharge introduced in FIGS. 9(a)–9(c). In this embodiment, a fill gas 12 introduced at positive pressure in the left end of the envelope 10 through a gas feed tube 101 is brought into co-rotation with the envelope 10 by an aluminum honeycomb collimator 102. The collimator 102 is just one of many possible auxiliary means for imparting rotational momentum to an axial gas stream. If the plasma column 21 takes the form of a single-ended flame rooted in the waveguide 61 pointing to the left (see FIG. 10(b)), initiation of an axial flow 13 will push the plasma in the direction of the flow. As a consequence, the plasma column 21 will take the form of a flame pointing to the right, with its blunt end still rooted in the waveguide 61. Furthermore, the presence of flow elongates the flame and gives it a more uniform brightness along the length of the aluminum sleeve 67. Microwave energy is probably transmitted farther down the aluminum with flow than without, because the extended plasma column 21 inside the aluminum sleeve 67 serves as a center conductor for coaxial mode propagation. One surprising advantage of such embodiments is that no upper limit (within the 30 kW capability of the power source 60) has been found on the amount of power which may be coupled to the plasma column 21. At high power with suitable flow rates, the flame tip extends beyond the end of the envelope 10. Measurements on a burn target placed near the downstream end of the quartz tube show that the flame tip is extremely well centered.

The embodiment 1100 illustrated in FIG. 11 has very attractive features for application as a plasma torch. First, very high microwave power may be coupled into the plasma column 21. Second, the plasma substantially fills the envelope 10 in the region where microwave energy is most strongly coupled to the column 21. The first feature gives this invention the capability to atomize waste streams with high throughput; the second prevents chemicals from leaking past the heating zone without being destroyed.

Figure 12:
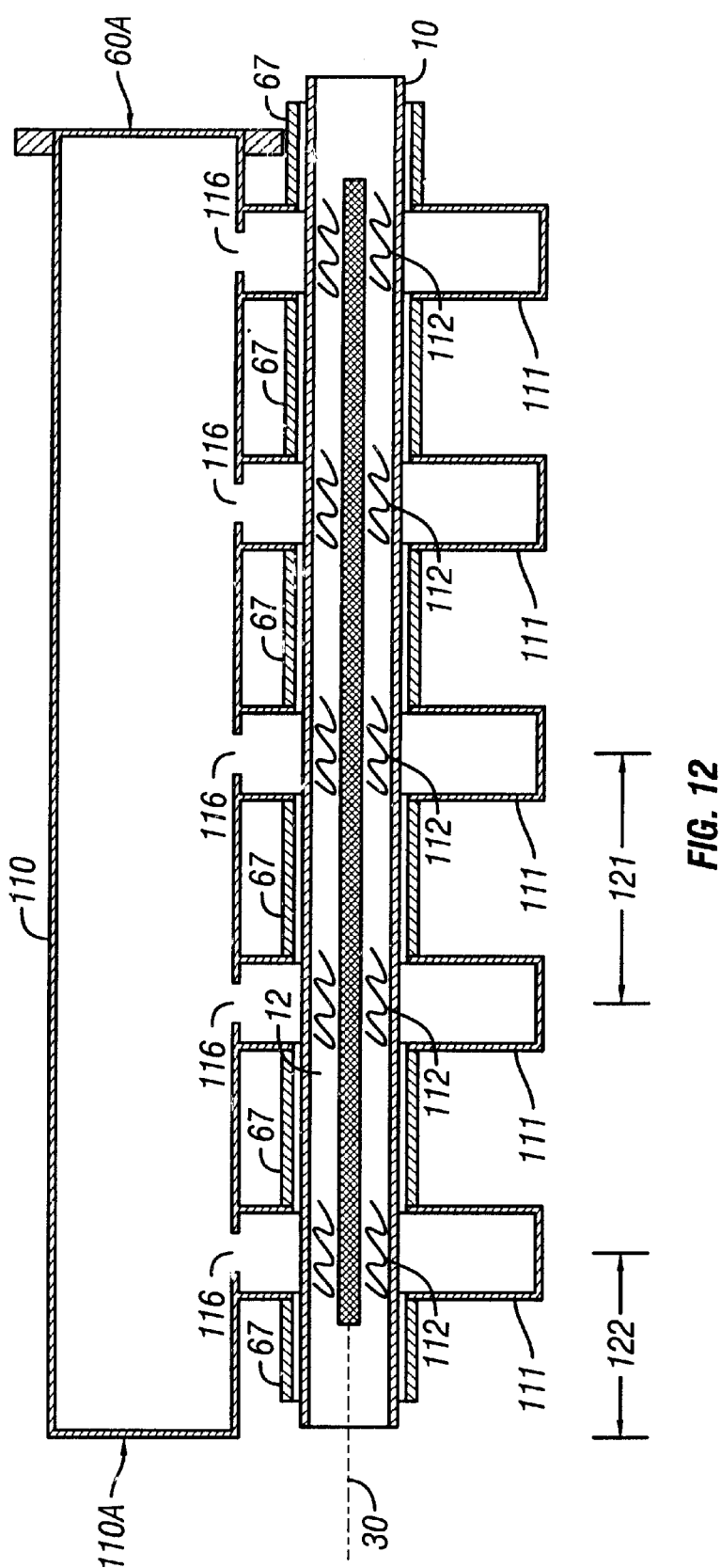
FIG. 12(a) is a cross-sectional schematic view of an embodiment using a plurality of resonant cavities to sustain an elongated plasma column.

In yet another embodiment powered by microwaves, a plasma column 21 may be formed that is both long and straight. FIG. 12 illustrates an embodiment in which a plurality of heating zones 112 repeat in modular form along the length of the envelope 10. This plurality of heating zones makes it possible to form a plasma column 21 many times longer than that which can be sustained using a single heating zone (See, for example the embodiment of FIG. 10(a)). A microwave power source (not shown) is operatively connected to a shorted waveguide 110 which, in turn, feeds the microwaves 60A into a plurality of resonant microwave cavities 111 through slots 116 located at antinodes in the standing wave pattern of the shorted waveguide 110. Said slots 116 may be separated from one another by a constant distance 121 equal to any integral number of effective wavelengths $\lambda_{eff}$ for the $TE_{10}$ fundamental mode in the input waveguide 110. Each resonant cavity 111 includes openings to enable a containment envelope 10 substantially parallel to an axis of the input waveguide 110 to pass through the plurality of resonant cavities 111. Electrically conducting sleeves 67 span the gaps between the plurality of resonant cavities ill and serve as shields against microwave leakage out the openings in the sides of the resonant cavities 111. The rotational axis 30 of the envelope 10 is positioned at the location of peak field intensity within the microwave cavities 111. As with the previously discussed embodiments, a means (not shown) for rotating the envelope 10 is provided. The resonant cavity 111 closest to the shorted end 110A of the input waveguide 110 is positioned a distance 122 equal to an integral number of quarter wavelengths from the shorted end 110A, one preferred distance 122 being ¾ $\lambda_{eff}$. The plasma-forming fill 12 is energized by microwaves in the plurality of heating zones 115 defined by the resonant microwave cavities 111. Because, as taught earlier in this patent, microwaves may propagate in coaxial mode inside the conducting sleeves 67, a single continuous plasma column 21 may be formed inside the rotating envelope 10. The axial uniformity of that plasma column 21 may be enhanced with gas flow along the length of the containment tube 10.

Figure 13A:
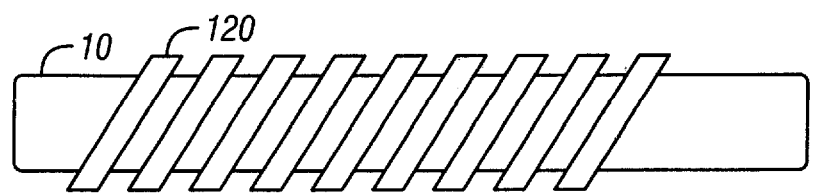
FIG. 13(a) and 13(b) are side and cross-sectional views of a radio frequency-driven embodiment.
Figure 13B:
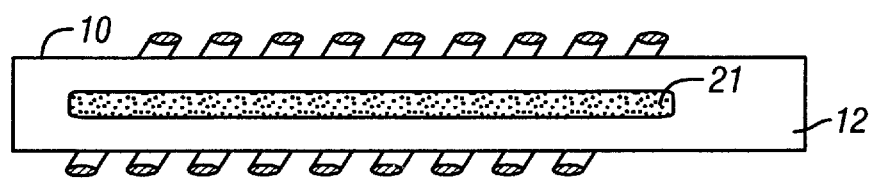

Radio frequency radiation can provide another means for energizing plasma in the embodiments of the present invention. Reference to FIGS. 13(a) and 13(b) illustrates a radio-frequency (rf) embodiment of the present invention that utilizes an induction coil 120 surrounding the rotating envelope 10 to energize a plasma forming fill 12 into a plasma column 21. As with conventional rf torches, satisfactory power supplies range in frequency from the kHz range to the MHz range. As with the previously discussed embodiments, a means of rotation must be provided such as that discussed with respect to FIG. 3.

Figure 14A:
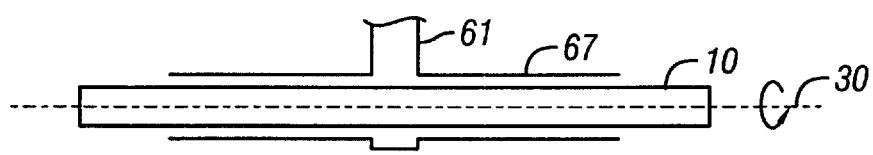
FIGS. 14(a) and 14(b) illustrate alternate means for bringing axially flowing gases into co-rotation with the containment envelope.
Figure 14B:
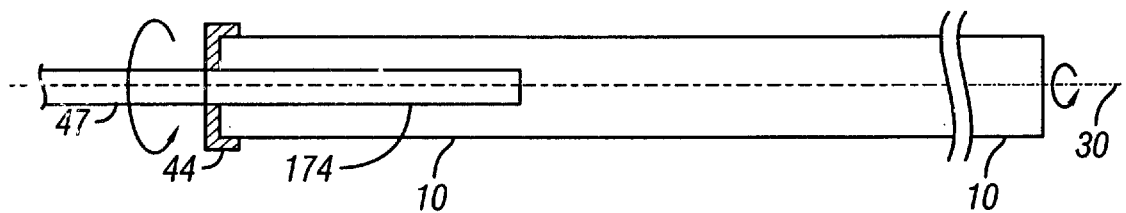

FIGS. 14(a) and 14(b) illustrate additional means for imparting angular momentum to the gases in an envelope 10, so as to maintain rigid rotor flow in the presence of natural or forced axial flows. As explained earlier with respect to FIG. 4(b) and FIG. 7, co-rotation may be induced by flowing gas, respectively, through openings in an end cap and through a honeycomb collimator disk within the envelope. FIG. 14(a) illustrates the use of a containment envelope 10 with large length-to-diameter ratio to induce co-rotation of the flowing gas. FIG. 14(b) shows the use of an axial feed tube 174 co-rotating with the envelope 10 to accomplish the same result. In the latter case, a stationary gas feed tube 47 makes a sliding seal against the rotating end cap 44. Other means, known to those having ordinary skill in the art, may be used to provide rigid rotor flow of the gases inside the containment envelope 10.

Figure 15A:
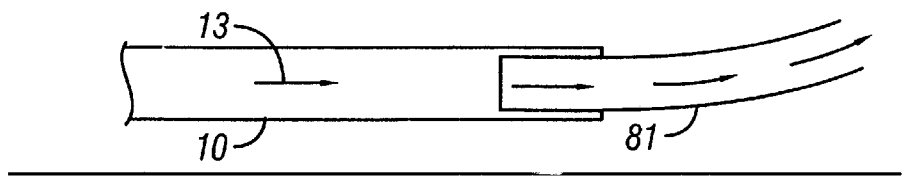
FIGS. 15(a) and 15(b) depict alternate means for creating an axial flow of gases through the envelope.
Figure 15B:
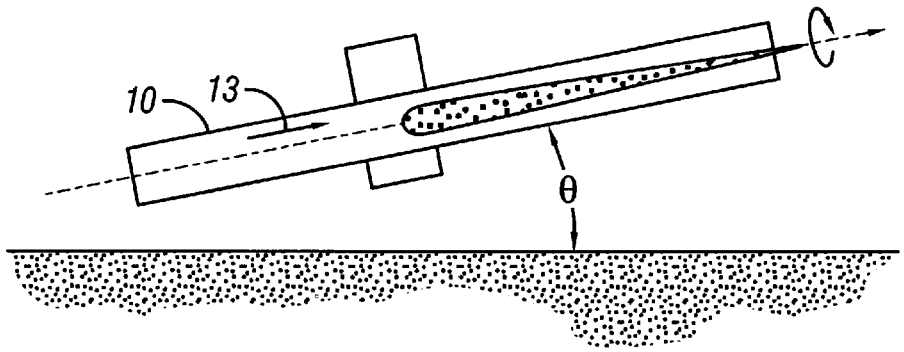

FIGS. 15(a) and 15(b) shows means for for inducing an axial gas flow 13 through the rotating envelope 10 apart from the application of positive pressure at an inlet end depicted in FIGS. 4(b), 4(c) and 4(d). As shown in FIG. 15(a), a suction tube 81 may be inserted in the outlet end of envelope 10. Alternatively, as indicated in FIG. 15(b), the envelope 10 can be tilted at some angle θ with respect to the horizontal, so that the buoyancy of the heated gas in the plasma column naturally drives an axial convective flow 13. The axis of rotation 30 remains substantially horizontal, since only a small tilt angle θ is required to induce a strong natural convection.

Figure 16A:
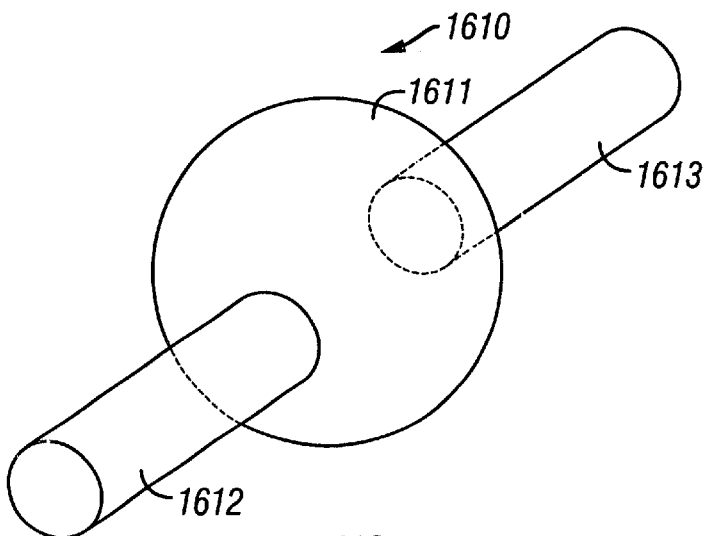
Figure 16B:
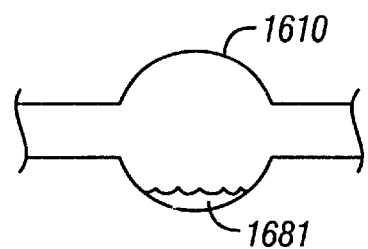

FIGS. 16(a) and 16(b) show an axially non-uniform containment envelope 1610 which permits utilization of liquid and solid materials as part of the plasma-forming fill 12 in the various embodiments of the rotating discharge tube described heretofore. As shown in FIG. 16(a) the axially non-uniform containment envelope 1610 includes a bulbous portion 1611 with two substantially cylindrical sections 1612 and 1613 extending out its opposing sides. As depicted in the FIG. 16(b), the bulbous portion 1611 serves as a reservoir for liquid or solid material 1681 which may by vaporized by external heating or by energy supplied from the energizing source of the discharge (and released from the plasma column, or a portion of the plasma column 21, extending into the bulbous portion 1611). The liquid or solid material 1681 undergoing phase change into a vapor may constitute the sole plasma-forming fill 12 or may be used in conjunction with a gaseous fill, such as argon or xenon, that may facilitate ignition of a discharge.

When used in conjunction with a gaseous fill, vapor of a liquid or solid material 1681 may be selectively confined about the axis of the rotating containment envelope 1610, providing its vapor has a lower mass density than the chosen gaseous fill. Examples of liquid and solid materials 1681 that take solid or liquid form at room temperature and may be confined in a vapor mixture with argon, include low density materials such as lithium, silicon, silicon dioxide, and sulfur. Heavier materials can be used in combination with a correspondingly denser gas, such as xenon. Medium-Z metals and their common salts may be confined about the axis of rotation by xenon, because of its high atomic weight of 131 AMU.

The principles described herein permit embodiments in which multiple gas constituents may be introduced into a rotating containment envelope in the form of concentric streams. The atomic and molecular constituents of the separate gas streams do not undergo substantial mixing if the separate gas streams are ordered radially by the mass density of their constituents, with the lightest gas innermost (the one with the lowest atomic or molecular weight) and the heaviest gas outermost. If the order is reversed, the layered rotating system will be subject to a Rayleigh Taylor instability and rapid mixing will occur.

Figure 17:
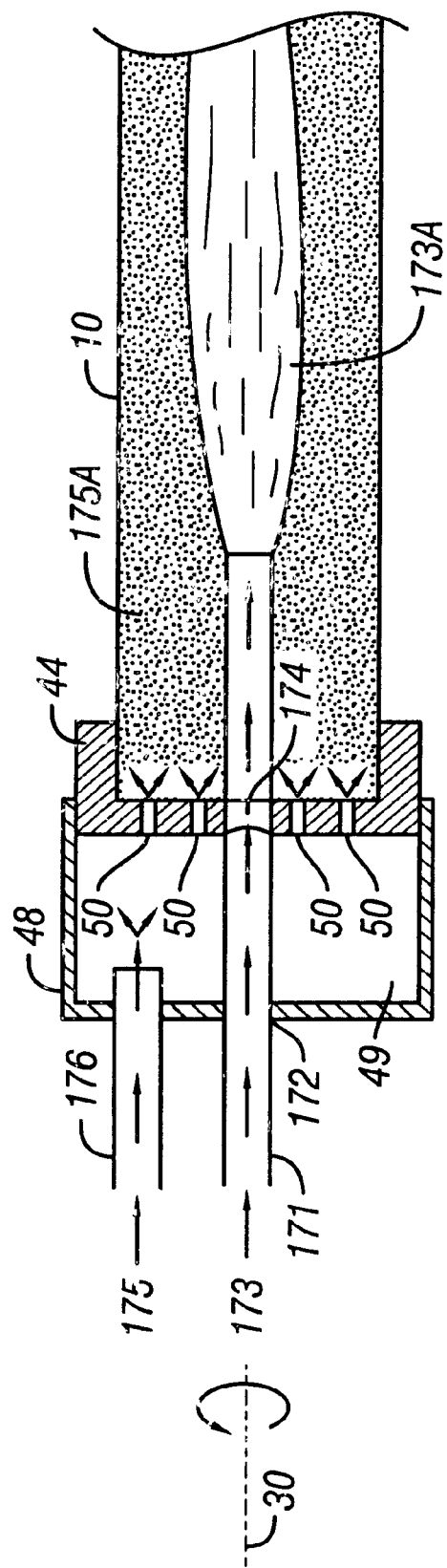
FIG. 17 is a side cross-sectional view of a dual-gas embodiment of the present invention.

Referring to the embodiment shown in FIG. 17, a first gas 173 of low mass density is injected through an axial tube 174 which co-rotates with the envelope 10 and the end cap 44. A second gas 175 of higher mass density is admitted through collimating holes 50 in the end cap 44. Passage of the first gas 173 through the small bore of the axial tube 174 transfers rotational momentum to it; passage of the second gas 175 through the collimating holes in end cap 44 does the same for it. Both the cup 48 and the axial feed tube 173 passing through it, make sliding seals against the end cap 44. Because the axial tube 174 lies wholly inside the radius of the collimating holes 50, the first gas 173 forms an axial stream 173A which is surrounded by an annular stream 175A of the second gas 175.

At the interface between the axial and annular streams 173A and 175A, respectively, mixing occurs only by the slow process of diffusion providing that the gases in the two streams are ordered by mass density as previously stated and the relative axial velocity of the two streams is sufficiently low for laminar flow to obtain at their boundary. If the inner and outer streams contain a fuel and an oxidant, an exothermic chemical reaction (i.e., combustion) may occur at their interface. This reaction can heat and/or sustain a plasma column if the interface lies near or inside the critical radius $r_c$ for the rotation speed of the envelope 10.

In two-stream systems heated by non-chemical means, xenon is a preferred choice of gas for the annular stream because of its low thermal conductivity (roughly 1/5 that of air) and its relatively high atomic weight. A sheath of xenon surrounding a central plasma column formed in a gas of lower mass density provides excellent thermal insulation. Argon is an attractive gas for use in the axial stream, because of the ease with which it can be ionized.

Another use of the axial gas stream 173A is to inject entrained samples, such as small droplets of a salt solution created with a nebulizer, into the plasma column. Following atomization in the hot plasma column, the constituent elements of these salts will remain confined within the plasma column, providing their elemental mass density is less than that of the plasma-forming gas in the axial stream. In atomic emission spectroscopy, this entrainment method is commonly used to feed samples into atmospheric pressure, arc sources which excite the characteristic spectral lines of these elements. Conventional arc source permit single-pass excitation of such samples, whereas the confinement properties of the present invention allow for accumulation of the dopant and, therefore, greater sensitivity for its detection.

While the invention herein disclosed has been described by means of specific embodiments and applications thereof, numerous modifications and variations could be made thereto by those skilled in the art without departing from the scope of the invention set forth in the claims.

What is claimed:

1. An apparatus for forming a stable equilibrium for a high pressure plasma column comprising:
   i) a containment envelope having a plasma-forming fill inside, wherein a window is mounted at one end of the containment envelope to permit transmission of a light beam in the direction of a substantially horizontal axis;
   ii) means for rotating the containment envelope about the substantially horizontal axis,
   iii) means for initiating a discharge in said plasma-forming fill, and
   iv) means for heating and sustaining the resulting plasma in a steady state or pulsed manner.

2. The apparatus of claim 1, wherein said containment envelope is of any shape as long as its minimum cross sectional dimension perpendicular to its rotation axis exceeds a radius at which the centrifugal force, for the chosen rotation speed, dominates over the gravitational force.

3. The apparatus of claim 2, wherein said means for initiating a discharge in said plasma-forming fill includes electrical, electromagnetic or chemical sources of energy.

4. The apparatus of claim 3, wherein said means for heating and sustaining the resulting plasma includes electrical, electromagnetic or chemical sources of energy, individually or in combination with one another.

5. The apparatus of claim 4, wherein said containment envelope is sealed to permit operation with plasma-forming fills comprised of material that under normal conditions is gaseous, or that changes into a gaseous phase during operation of the apparatus.

6. The apparatus of claim 5, wherein said means for heating and sustaining the plasma column repeats in modular form along the rotation axis to produce a plasma column many times longer in the axial direction than one heated at a single location only.

7. The apparatus of claim 5 for use as a light source, wherein the window permits transmission of ultraviolet, visible, and infrared radiation in the direction of the rotation axis.

8. An apparatus for forming a high pressure plasma column comprising:
   i) a containment envelope having a plasma-forming fill inside, wherein a window is mounted at one end of the containment envelope to permit transmission of a light beam in the direction of an axis;
   ii) means for rotating the containment envelope about the axis;
   iii) means for initiating a discharge in said plasma-forming fill, and
   iv) means for heating and sustaining the resulting plasma in a steady state or pulsed manner.

9. The apparatus of claim 8, wherein said containment envelope is of any shape as long as its minimum cross sectional dimension perpendicular to its rotation axis exceeds a radius at which the centrifugal force, for the chosen rotation speed, dominates over the gravitational force.

10. The apparatus of claim 9, wherein said means for initiating a discharge in said plasma-forming fill includes electrical, electromagnetic or chemical sources of energy.

11. The apparatus of claim 10, wherein said means for heating and sustaining the resulting plasma includes electrical, electromagnetic, or chemical sources of energy, and combinations thereof.

12. The apparatus of claim 11, wherein said containment envelope is sealed to permit operation with plasma-forming fills comprised of material that under normal conditions is gaseous, or that changes into a gaseous phase during operation of the apparatus.

13. The apparatus of claim 12, wherein said means for heating and sustaining the plasma column repeats in modular form along the rotation axis to produce a plasma column many times longer in the axial direction than one heated at a single location only.

14. The apparatus of claim 12, for use as a light source, wherein the window permits transmission of ultraviolet, visible, and infrared radiation in the direction of the rotation axis.

15. An apparatus for forming a stable equilibrium for a high pressure plasma column comprising:
   i) an open-ended containment envelope having a plasma-forming fill, wherein the open-ended containment envelope is configured to permit a flow of gases along a substantially horizontal axis;
   ii) means for rotating the containment envelope about the substantially horizontal axis;
   iii) means for initiating a discharge in said plasma-forming fill; and
   iv) means for heating and sustaining the resulting plasma in a steady state or pulsed manner.

16. The apparatus of claim 15, wherein said means for heating and sustaining the plasma column repeats in modular form along the rotation axis so as to produce a plasma column many times longer in the axial direction than one heated at a single location only.

17. The apparatus of claim 15 or 16, wherein means are provided to ensure that the gases flowing through said envelope co-rotate with the envelope in close approximation to rigid rotor motion.

18. The apparatus of claim 17, wherein said plasma column is elongated in the direction of the rotation axis to produce a plume or flame.

19. The apparatus of claim 18, wherein two or more gas streams flowing through said envelope do not mix appreciably with one another if those streams are arranged in a radially ordered system such that the mass densities of the stream constituents increase with radius.

20. The apparatus of claim 19, wherein dopants introduced in an axial stream of said radially ordered system remain confined in the axial stream if the mass densities of such dopants (following atomization in the plasma column of a dopant-containing substance) are less than that of the gas in the axial stream or the gas in an annular stream immediately surrounding it.

21. The apparatus of claim 15 for use as a plasma torch, wherein a plasma flame that is extendable beyond the end of the containment envelope is sustained by electrodeless means or by electric current between hollow electrodes.

22. The apparatus of claim for use in the chemical processing of pure gas streams and gas streams with entrained liquids and solids, wherein the plasma column substantially fills a bore of the containment envelope.

23. An apparatus for forming a high pressure plasma column comprising:
   i) an open-ended containment envelope having a plasma-forming fill inside, wherein the open-ended containment envelope is configured to permit a flow of gases along an axis;
   ii) means for rotating the containment envelope about the axis;
   iii) means for initiating a discharge in said plasma-forming fill, and iv) means for heating and sustaining the resulting plasma in a steady state or pulsed manner.

24. The apparatus of claim 23, wherein said means for heating and sustaining the plasma column repeats in modular form along the rotation axis so as to produce a plasma column many times longer in the axial direction than one heated at a single location only.

25. The apparatus as in claim 23, wherein means are provided to ensure that the gases flowing through said envelope co-rotate with the envelope in close approximation to rigid rotor motion.

26. The apparatus of claim 25, wherein said plasma column is elongated in the direction of the rotation axis to produce a plume or flame.

27. The apparatus of claim 26, wherein two or more gas streams flowing through said envelope do not mix appreciably with one another if those streams are arranged in a radially ordered system such that the mass densities of the stream constituents increase with radius.

28. The apparatus of claim 27, wherein dopants introduced in an axial stream of said radially ordered system remain confined in the axial stream if the mass densities of such dopants (following atomization in the plasma column of a dopant-containing substance) are less than that of the gas in the axial stream or the gas in an annular stream immediately surrounding it.

29. The apparatus of claim 23 or use as a plasma torch, wherein a plasma flame that is extendable beyond the end of the containment envelope is sustained by electrodeless means or by electric current between hollow electrodes.

30. The apparatus of claim 23 for use in the chemical processing of pure gas streams and gas streams with entrained liquids and solids, wherein the plasma column substantially fills a bore of the containment envelope.

* * * * *

UNITED STATES PATENT AND TRADEMARK OFFICE
CERTIFICATE OF CORRECTION

PATENT NO.   : 6,417,625 B1
DATED        : July 9, 2002
INVENTOR(S)  : Brooks et al.

It is certified that error appears in the above-identified patent and that said Letters Patent is hereby corrected as shown below:

Column 21,
Line 22, after "claim" insert -- 15 --;
Line 36, after "and" begin a new paragraph; and Column 22,
Line 27, change "or" to -- for --.

Signed and Sealed this

Seventh Day of January, 2003

JAMES E. ROGAN
*Director of the United States Patent and Trademark Office*